(12) United States Patent
Amou et al.

(10) Patent No.: US 7,193,009 B2
(45) Date of Patent: *Mar. 20, 2007

(54) ELECTRONIC DEVICE USING LOW DIELECTRIC LOSS TANGENT INSULATORS FOR HIGH FREQUENCY SIGNALS

(75) Inventors: Satoru Amou, Hitachi (JP); Akira Nagai, Hitachi (JP); Shinji Yamada, Tsukuba (JP); Takao Ishikawa, Hitachi (JP); Akio Takahashi, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 247 days.

This patent is subject to a terminal disclaimer.

(21) Appl. No.: 10/434,118

(22) Filed: May 9, 2003

(65) Prior Publication Data

US 2004/0039127 A1    Feb. 26, 2004

(30) Foreign Application Priority Data

Aug. 26, 2002   (JP) .............................. 2002-244520

(51) Int. Cl.
*C08L 9/00*    (2006.01)
(52) U.S. Cl. ...................... 524/575; 524/424; 524/430; 524/433
(58) Field of Classification Search ................ 524/575, 524/425, 430, 433
See application file for complete search history.

(56) References Cited

U.S. PATENT DOCUMENTS

| | | | |
|---|---|---|---|
| 4,027,063 A * | 5/1977 | Fujiwara et al. ............. | 442/117 |
| 6,190,834 B1 * | 2/2001 | Narahara et al. ......... | 430/284.1 |
| 6,756,441 B2 * | 6/2004 | Amou et al. ................ | 524/575 |
| 6,855,952 B2 * | 2/2005 | Nagai et al. .................. | 257/40 |

FOREIGN PATENT DOCUMENTS

| | | |
|---|---|---|
| JP | 60-144307 | 7/1985 |
| JP | 2003-12710 | 1/2003 |
| JP | 2003-342309 | 12/2003 |
| JP | 2004-083681 | 3/2004 |

\* cited by examiner

*Primary Examiner*—Robert D. Harlan
(74) *Attorney, Agent, or Firm*—Antonelli, Terry, Stout and Kraus, LLP.

(57) ABSTRACT

An electronic device for high frequency signals having a small dielectric loss and a high efficiency is provided, in which a low dielectric loss tangent resin composition is used, for coping with high frequency signals, as an insulating layer. The electronic device is fabricated using an insulating layer containing a crosslinked structure of a crosslinking ingredient represented by the following general formula (I):

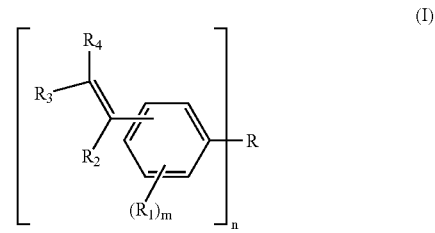

(where R represents a hydrocarbon skeleton, $R_1$, which may be identical or different from each other, represents a hydrogen atom or a hydrocarbon group of 1 to 20 carbon atoms, $R_2$, $R_3$ and $R_4$, which may be identical or different from each other, each represents a hydrogen atom or a hydrocarbon group of 1 to 6 carbon atoms, m is an integer of 1 to 4 and n is an integer of 2 or greater).

19 Claims, 26 Drawing Sheets

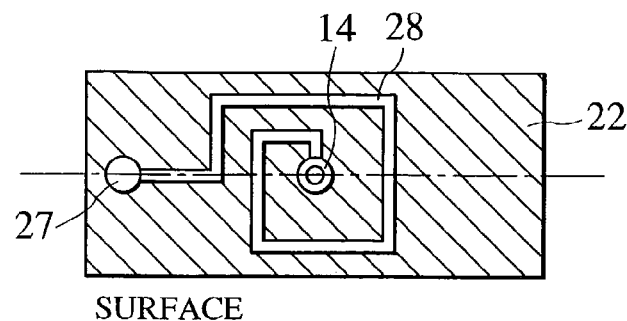
FIG.10A
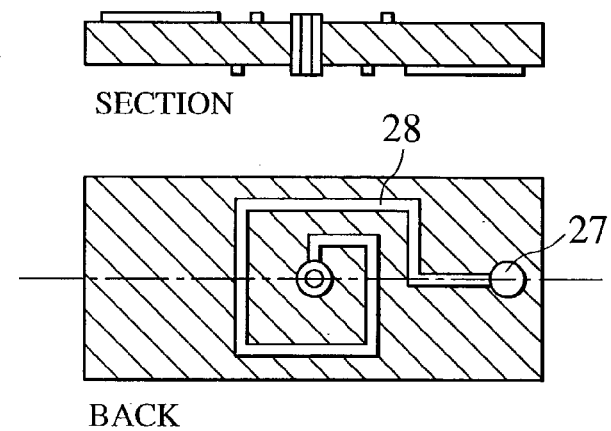
FIG.10B
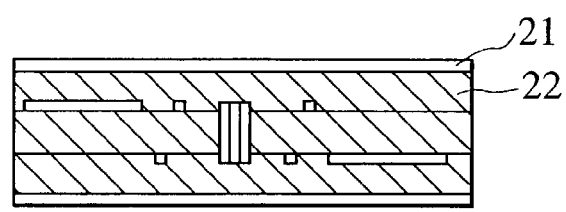
FIG.10C
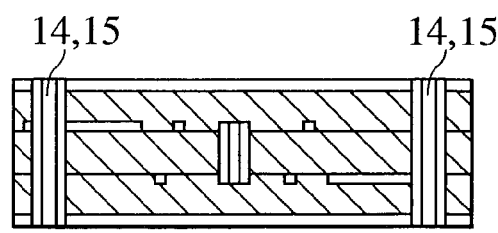
FIG.10D
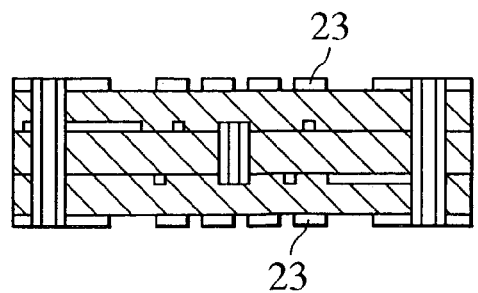

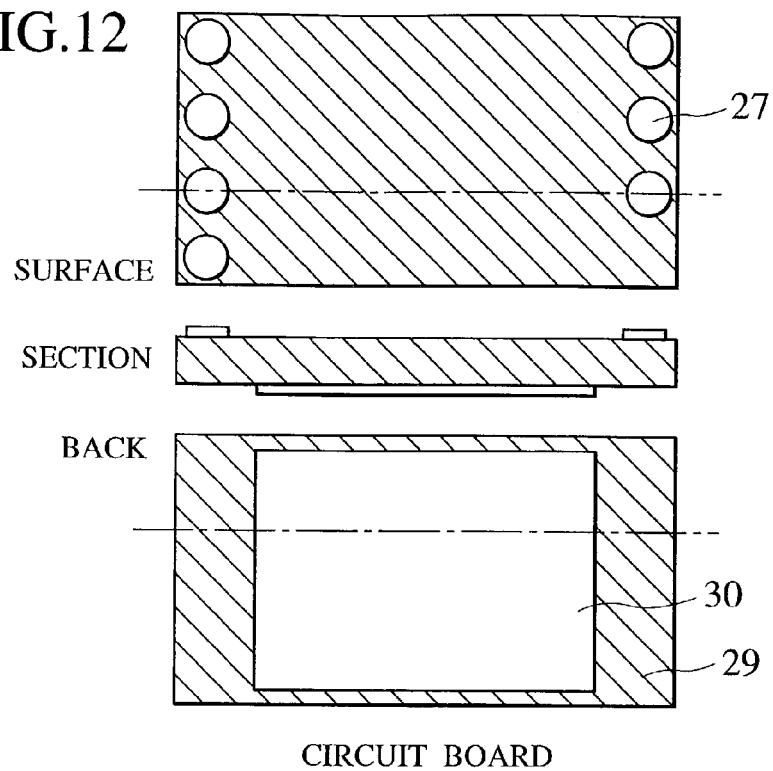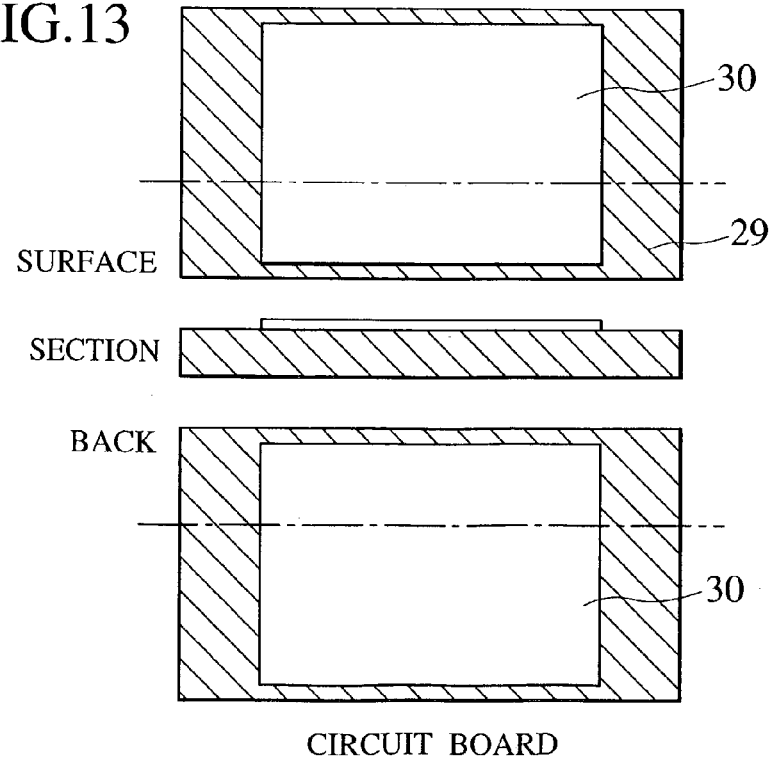

CIRCUIT BOARD

CIRCUIT BOARD

FIG.22A
SURFACE
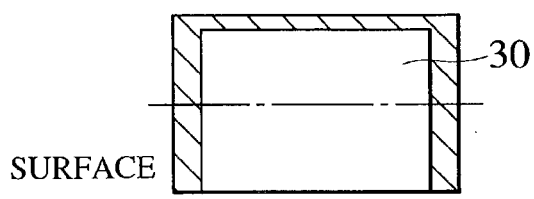
SECTION
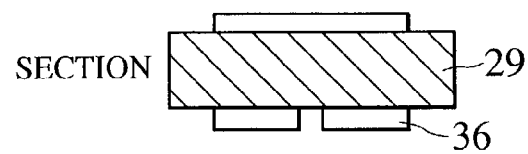
BACK
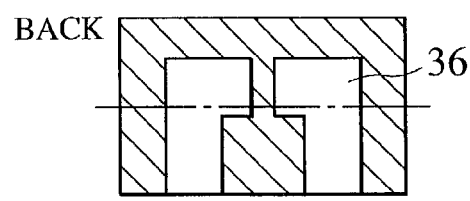
FIG.22B
SURFACE
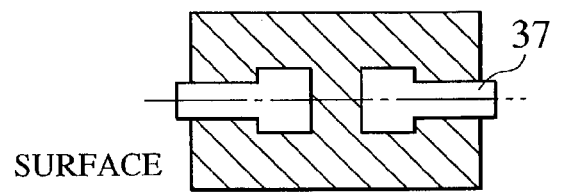
SECTION
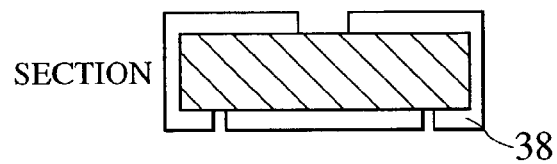
BACK
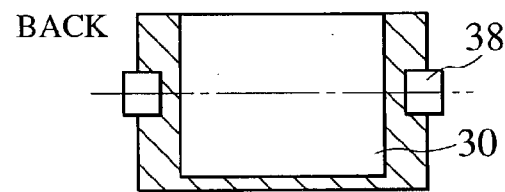
FIG.22C
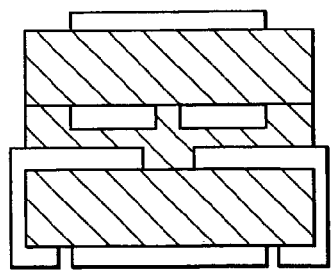

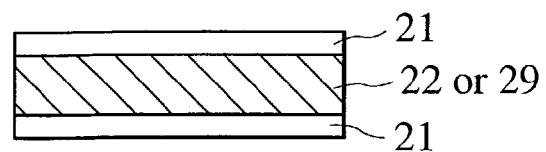
FIG. 27A SECTION
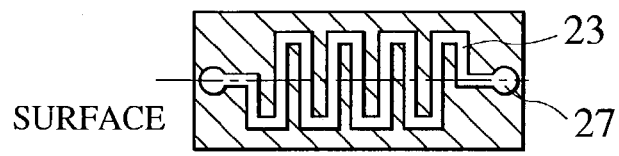
SURFACE
FIG. 27B SECTION
BACK
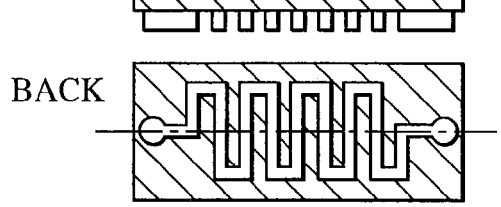
FIG. 27C SECTION
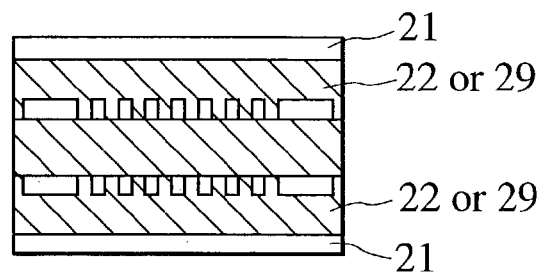
FIG. 27D SECTION
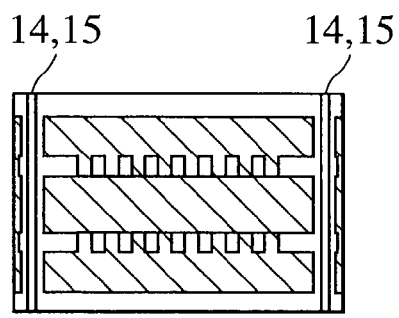
FIG. 27E SECTION
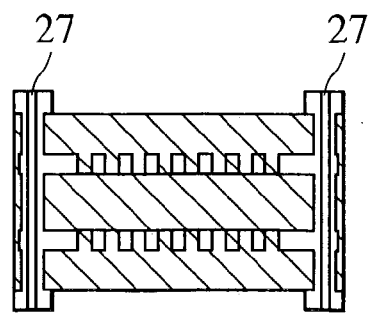

ELECTRONIC DEVICE USING LOW DIELECTRIC LOSS TANGENT INSULATORS FOR HIGH FREQUENCY SIGNALS

BACKGROUND OF THE INVENTION

The present invention relates to an electronic device for high frequency signals in which, as an insulating layer, a low dielectric loss tangent resin composition is used for coping with high frequency signals.

In recent years, signal bands of information communication equipment, such as a PHS or a portable telephone, and the CPU clock times of computers have reached GHz bands, and the working frequency has become higher. The dielectric loss of electric signals is in proportion to the product of the square root of a specific dielectric constant, the dielectric loss tangent of an insulator forming the circuit and the frequency of the signals being used. Accordingly, the dielectric loss increases as the frequency of the signals being used increases. Since an increase in the dielectric loss attenuates the electric signals so as to deteriorate the reliability of the signals, it is necessary to select the insulating material from materials of low dielectric constant and low dielectric loss tangent to suppress such a loss. To lower the dielectric constant and the dielectric loss tangent of an insulator, it is effective to remove polar groups in the molecular structure, and fluoro resins, curable polyolefins, cyanate ester type resins, curable polyphenylene oxides, allyl modified polyphenylene ethers, polyvinyl benzyl ether, or divinyl benzene or divinyl naphthalene-modified polyether imides have been proposed.

Fluoro resins typically represented by polytetrafluoroethylene (PTFE) have a low dielectric constant and low dielectric loss tangent and are used for insulating layers of various electronic devices that are designed to handle high frequency signals. On the other hand, various non-fluoro resins of low dielectric constant and low dielectric loss tangent, which are soluble to organic solvents and are handled easily, have also been studied. They include various examples, for example, dienic polymers, such as polybutadiene impregnated into glass cloth and cured by peroxides, as disclosed in Japanese Patent Laid-open 8-208856; cyclic polyolefins formed by introducing epoxy groups into norbornene series addition type polymers, as disclosed in Japanese Patent Laid-open 10-158337; cyanate esters, dienic polymers and epoxy resins heated into B stage, as disclosed in Japanese Patent Laid-open 11-124491; modified resins including polyphenylene oxides, dienic polymers and triallyl isocyanates, as disclosed in Japanese Patent Laid-open 9-118759; resin compositions comprising, for example, allylated polyphenylene ethers and triallylisocyanates, as disclosed in Japanese Patent Laid-open 9-246429; polyetherimides alloyed with styrene, divinyl benzene or divinyl naphthalene, as disclosed in Japanese Patent Laid-open 5-156159, and resin compositions comprising thermosetting resins having vinyl benzyl ether groups and various kinds of additives, as disclosed in Japanese Patent Laid-open 5-78552 and 2001-247733. Since low dielectric constant, low dielectric loss tangent resin compositions have to endure electric device production steps, including steps such as solder reflow and gold wire bonding, each of them is designed as a thermosetting resin.

An insulating layer using a low dielectric constant, low dielectric loss tangent resin composition has a characteristic that is capable of decreasing the dielectric loss of high frequency signals, as well as being capable of attaining a high speed transmission and high characteristic impedance.

On the other hand, the insulating layer of high frequency circuits requires formation of delay circuits, impedance matching of wiring substrates in low impedance circuits, refinement of the wiring pattern, constitution of composite circuit incorporating capacitors in the substrate per se and the like, and the insulating layer requires a higher dielectric constant in some cases. Therefore, various proposals have been made, for example, to provide an electronic device using a high dielectric and low dielectric loss tangent insulating layer, as described in Japanese Laid-open No. 2000-91717, and electronic devices formed by compositing a high dielectric constant layer, and a low dielectric constant layer as described in Japanese Patent Laid-open Nos. 2001-247733 and 2001-345212. The high dielectric constant and low dielectric loss tangent insulating film is prepared by dispersing a high dielectric insulating material, such as a ceramic powder or metal powder applied with insulation treatment, in the low dielectric constant and low dielectric loss tangent insulating layer described above.

As described above, in an electronic device for high frequency signals, it is necessary that the dielectric constant of the insulating layer thereof be controlled depending on the property of the circuit to be formed. However, lowering of the dielectric loss tangent of the insulating layer is essential in any case in order to decrease the dielectric loss.

SUMMARY OF THE INVENTION

It is therefore an object of the present invention to provide an electronic device for high frequency signals with low dielectric loss using, for an insulating layer, a crosslinked structure of a low dielectric loss tangent resin composition containing a multi-function styrene compound having dielectric characteristics that are excellent in comparison to existent insulators.

The foregoing object can be attained by the present invention as will be described below.

An electronic device for high frequency signals in accordance with the invention comprises a conductor wiring for transmitting electric signals at 0.3 to 100 GHz and an insulating layer, which is a curing product of a thermosetting resin composition, and the insulating layer is formed by using a resin composition containing a crosslinking ingredient represented by the following general formula (I). This can provide a lower dielectric loss tangent insulating layer than existent insulating layers formed of thermosetting resins and can provide a highly efficient electronic device for high frequency signals with lower dielectric loss than existent electronic devices for high frequency signals:

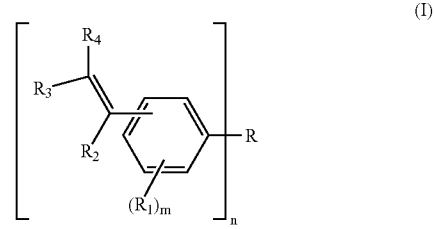

(where R represents a hydrocarbon skeleton, $R_1$, which may be identical or different from each other, represents a hydrogen atom or a hydrocarbon group of 1 to 20 carbon atoms, $R_2$, $R_3$ and R4, which may be identical or different from each other, each represents a hydrogen atom or a hydrocarbon group of 1 to 6 carbon atoms, m is an integer of 1 to 4 and n is an integer of 2 or greater).

This invention is attained basically by applying the crosslinked structure of a low dielectric loss tangent multi-functional styrene compound represented by the general formula (I) to an insulating layer of an electronic device for high frequency signals. The curing product thereof has a dielectric constant at 1 GHz of less than about 2.6 and a dielectric loss tangent of less than 0.0025 at 1 GHz, which is an extremely lower dielectric loss tangent compared with existent materials. This is because the multi-functional styrene compound of the invention does not contain polar groups, such as ether groups, carbonyl groups and amino groups, in the structure. In an example of the existent materials, while use of divinyl benzene as the crosslinking agent has been studied in order to obtain a similar effect, since divinyl benzene is volatile, it evaporates in the drying and curing steps of the resin composition, and it is difficult to control the characteristics of the curing product.

Further, according to the invention, the dielectric constant of the insulating layer can be controlled while suppressing a remarkable increase in the dielectric loss tangent by blending organic and inorganic insulators of different dielectric constants with the multi-functional styrene compound. This can produce an electronic device for high frequency signals that is provided with characteristics such as high speed transmission and the ability to effect reduction of the size of the device.

DESCRIPTION OF ACCOMPANYING DRAWINGS

Other objects and advantages of the invention will become apparent from the following description of various embodiments with reference to the accompanying drawings, in which.

Figure 7A:
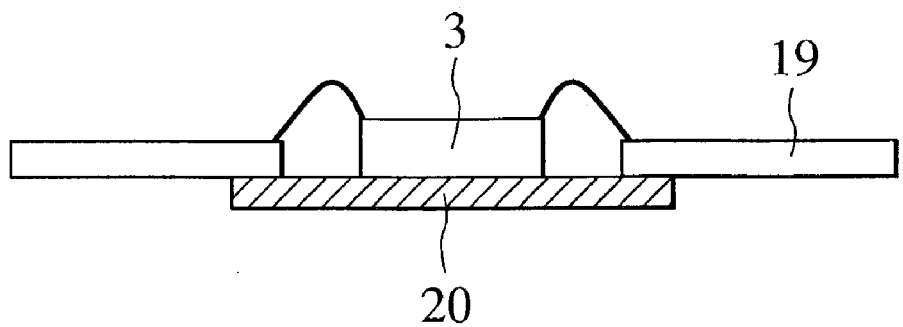
Figure 7B:
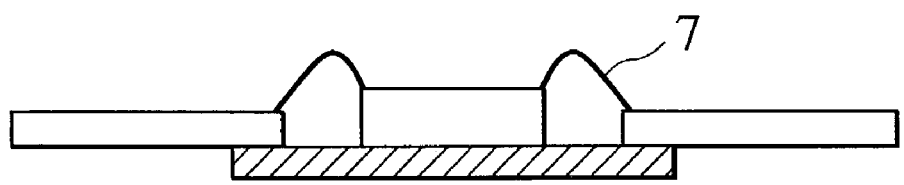
Figure 7C:
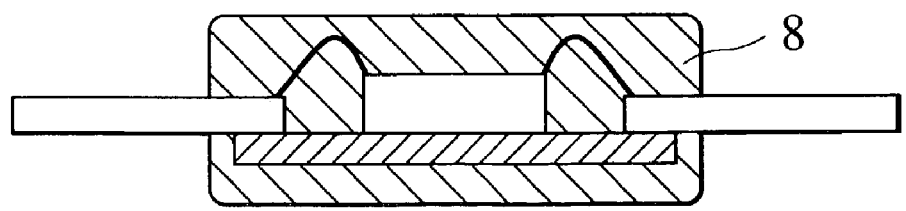
Figure 14:
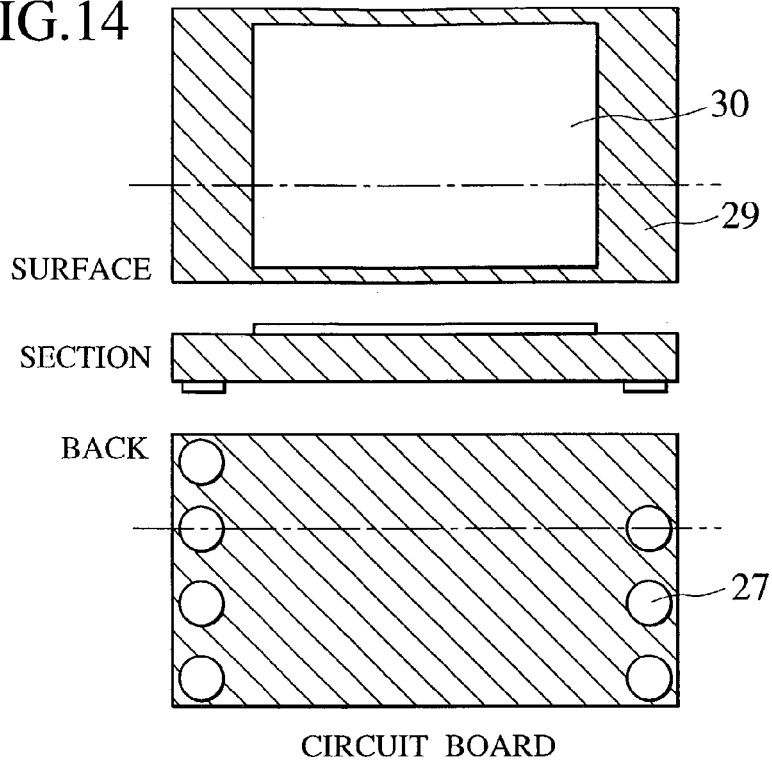
Figure 15:
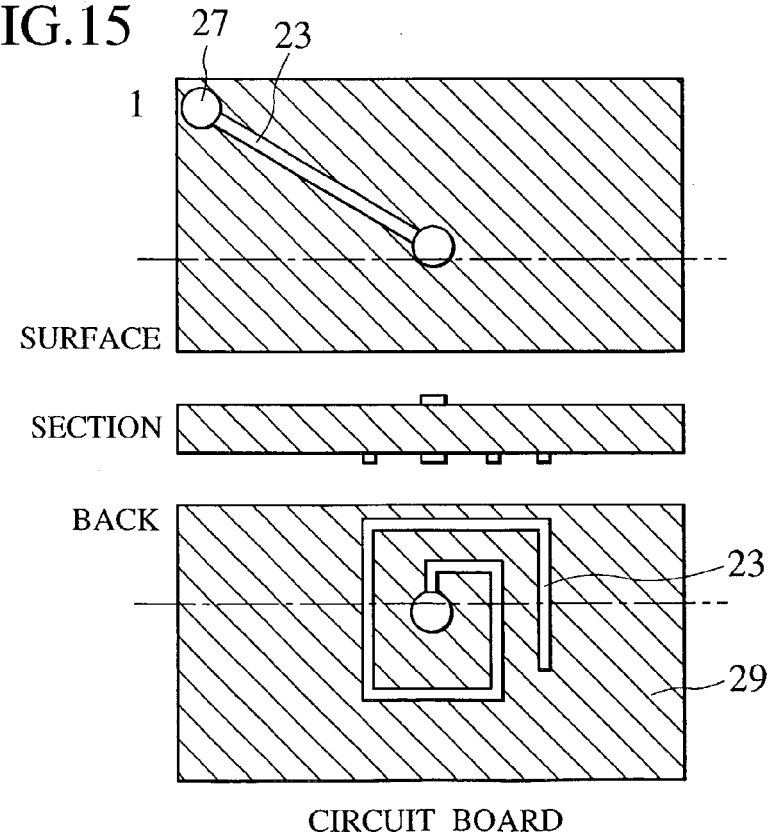
Figure 16:
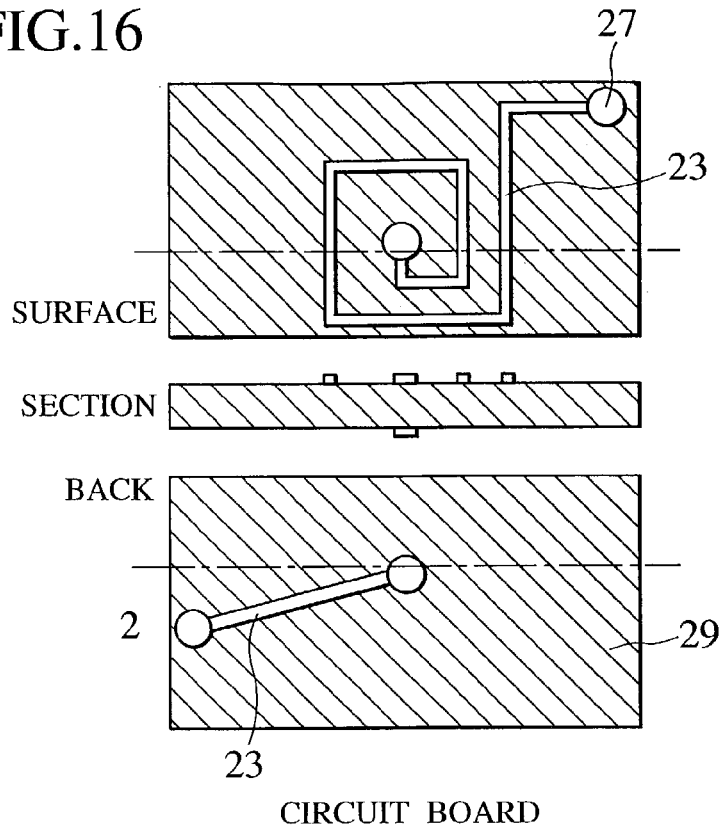
Figure 17:
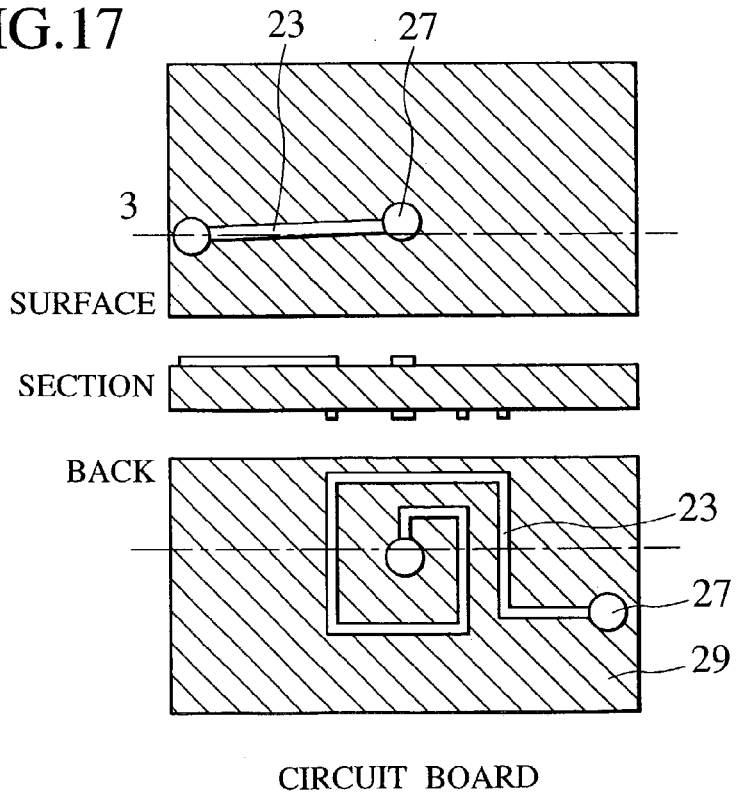
Figure 18:
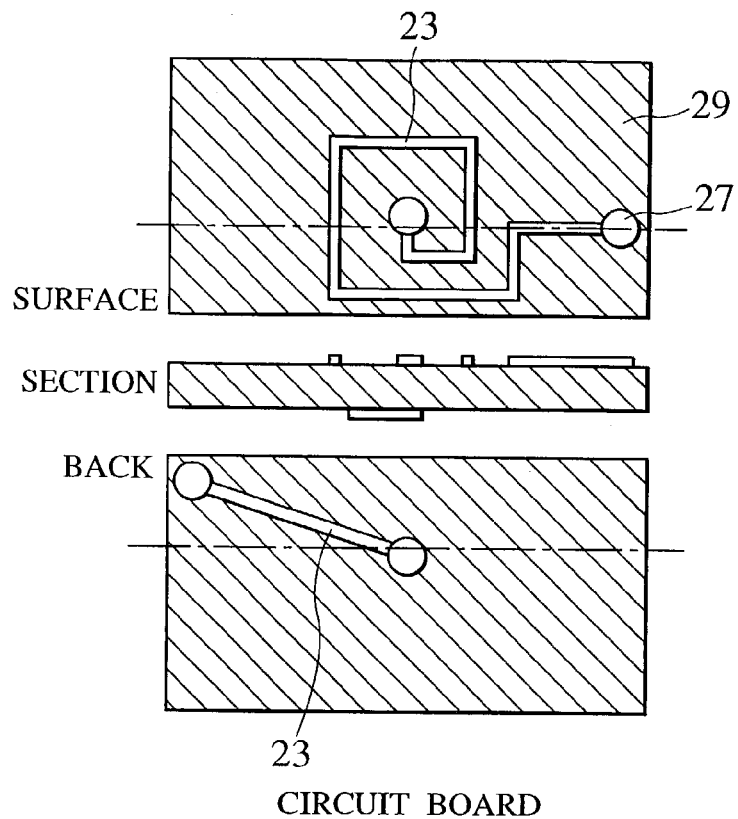
Figure 19:
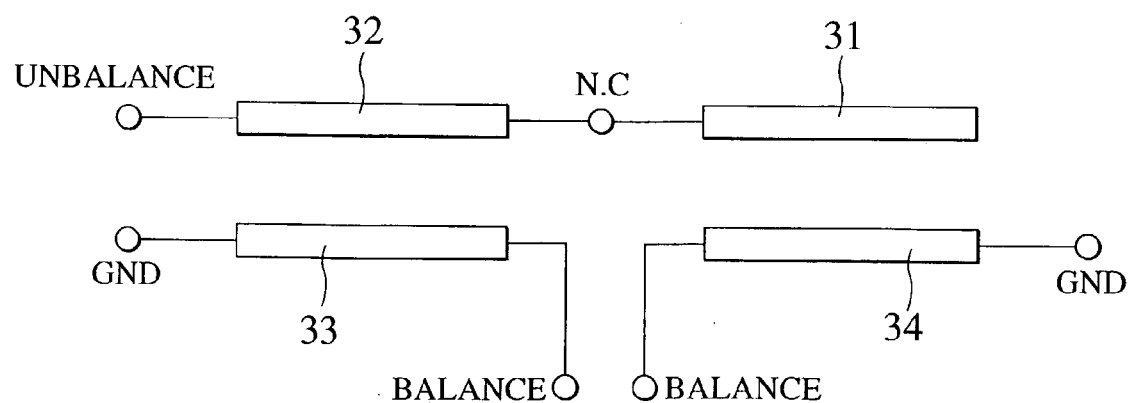
Figure 20:
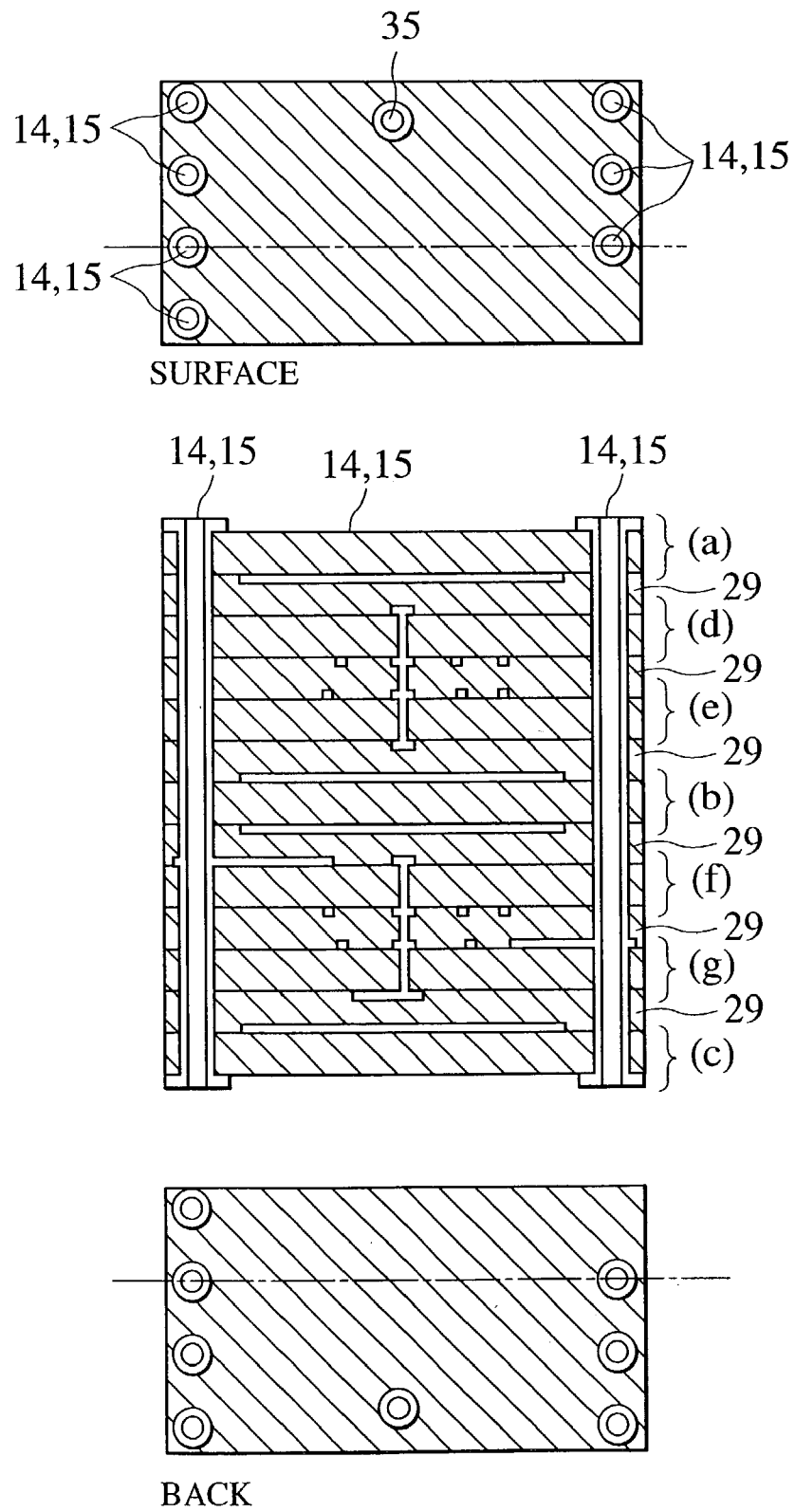
Figure 21:
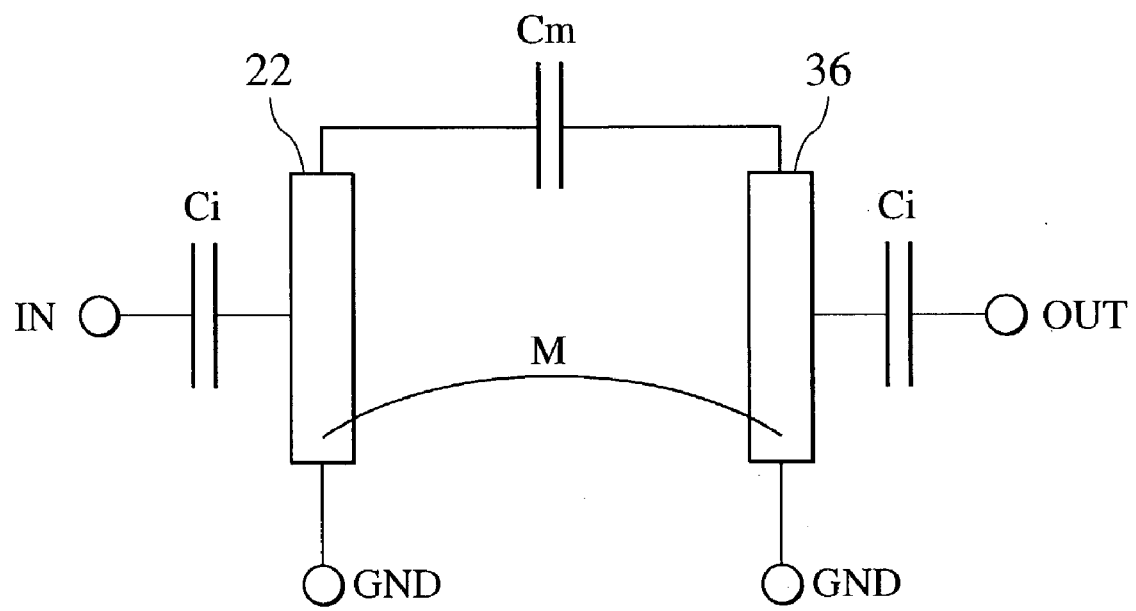
Figure 23A:
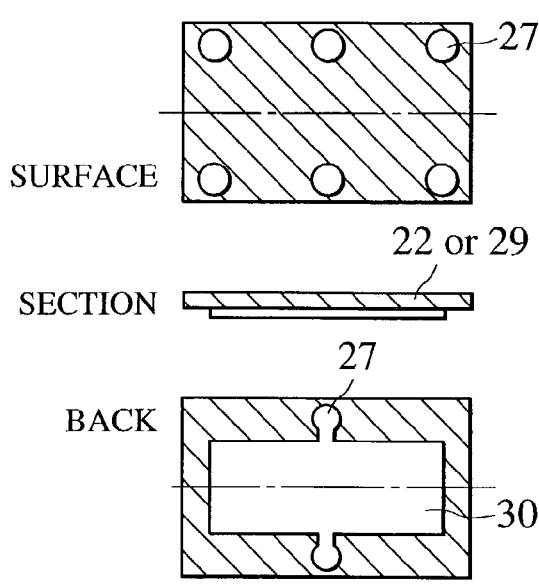
Figure 24:
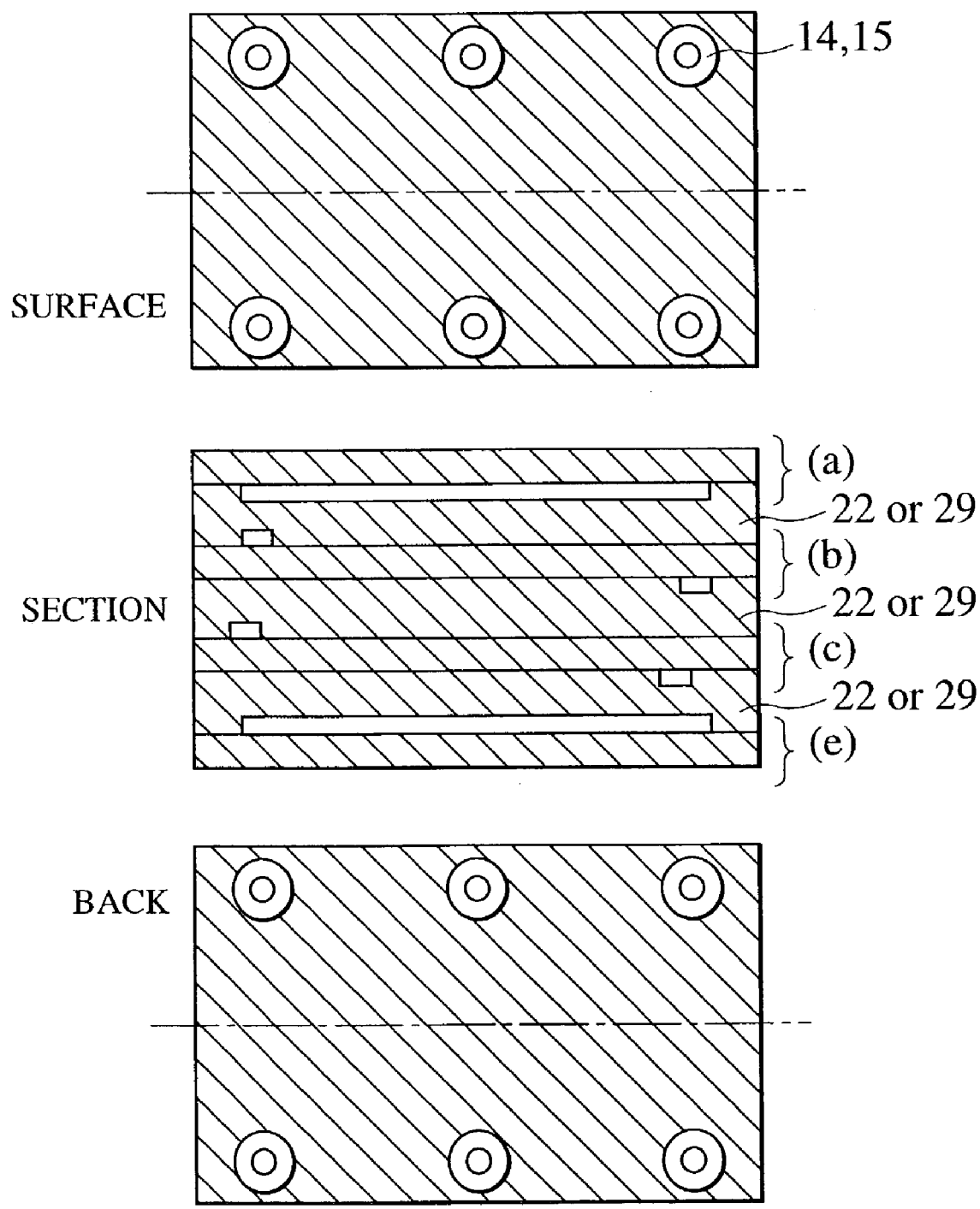
Figure 25:
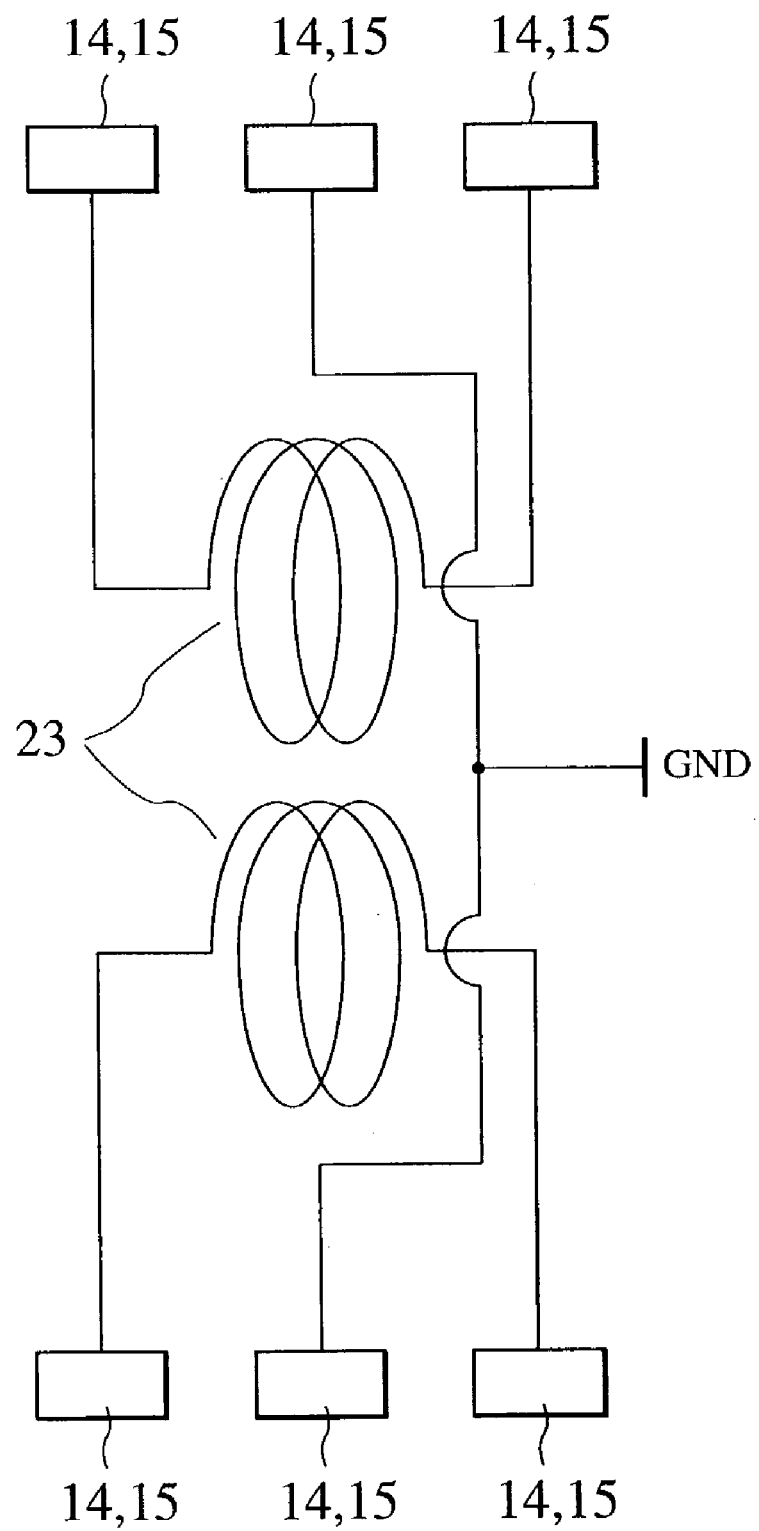
Figure 26:
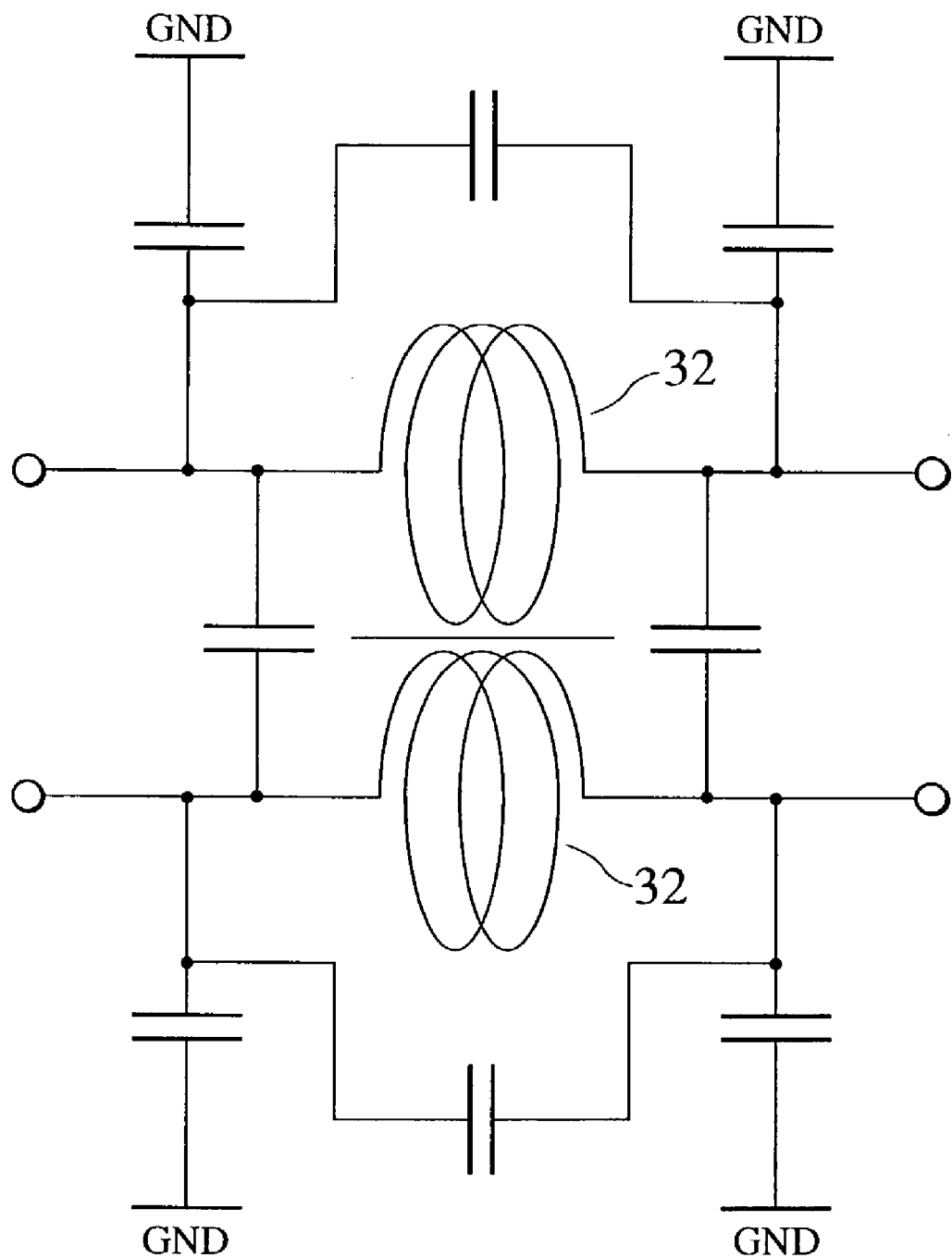
Figure 28:
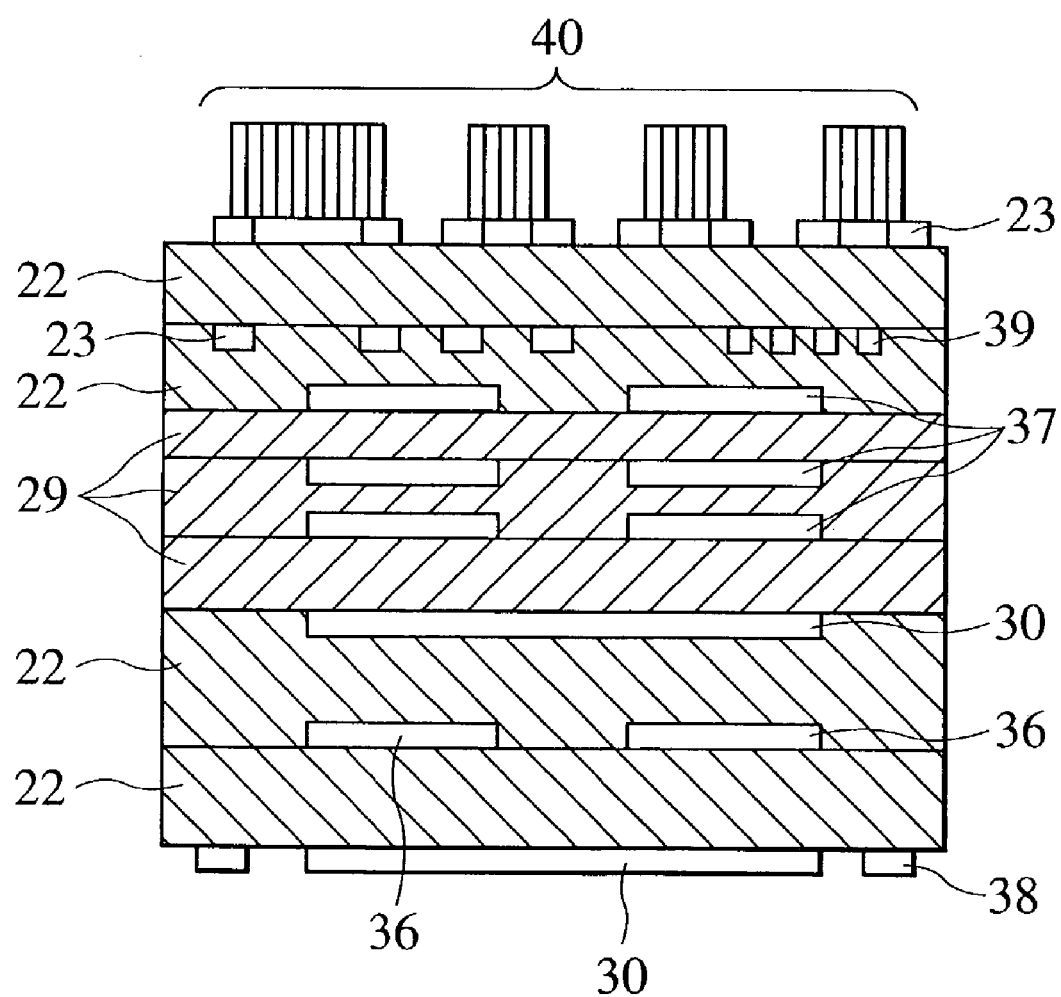
Figure 29:
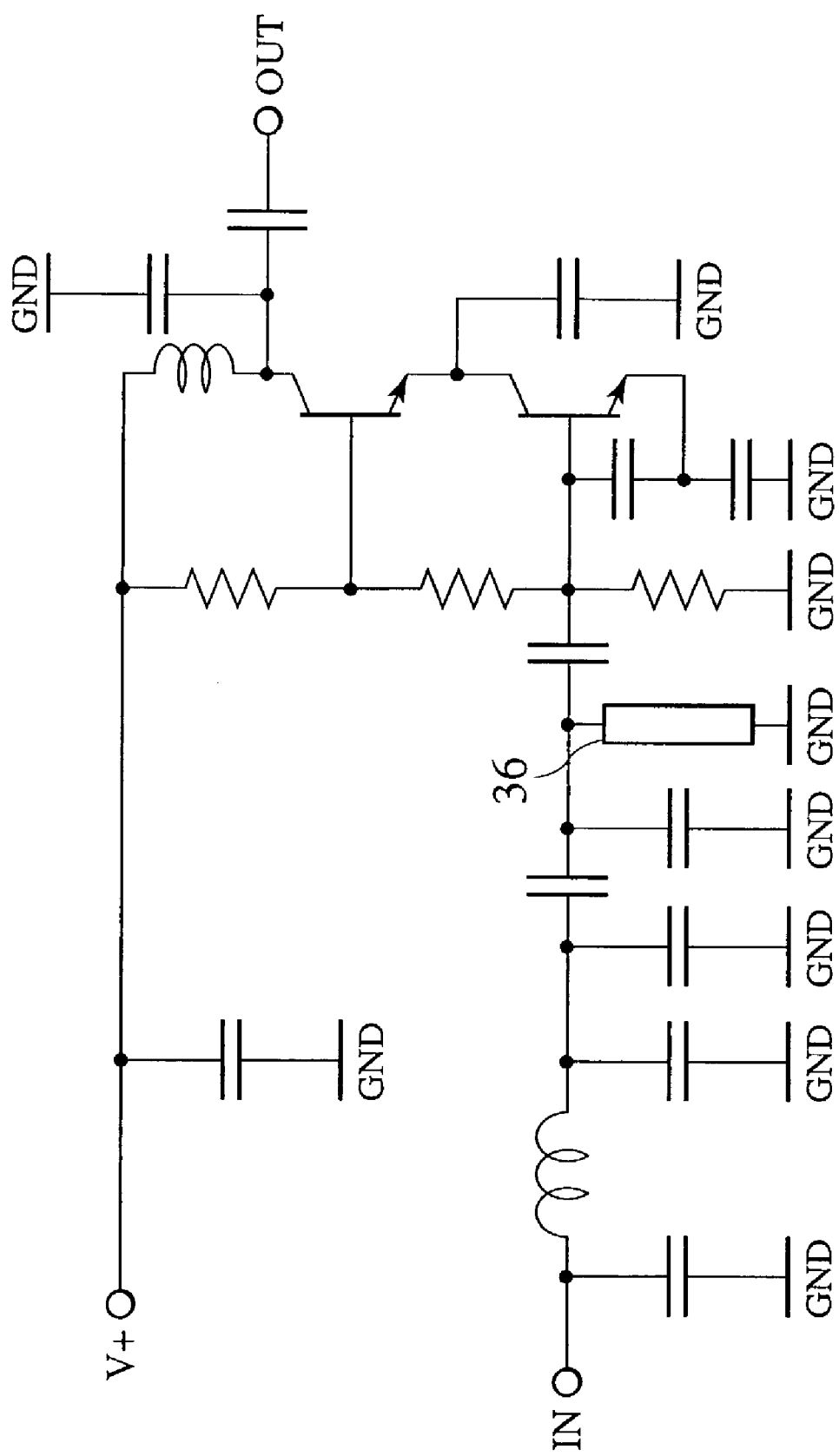
Figure 30:
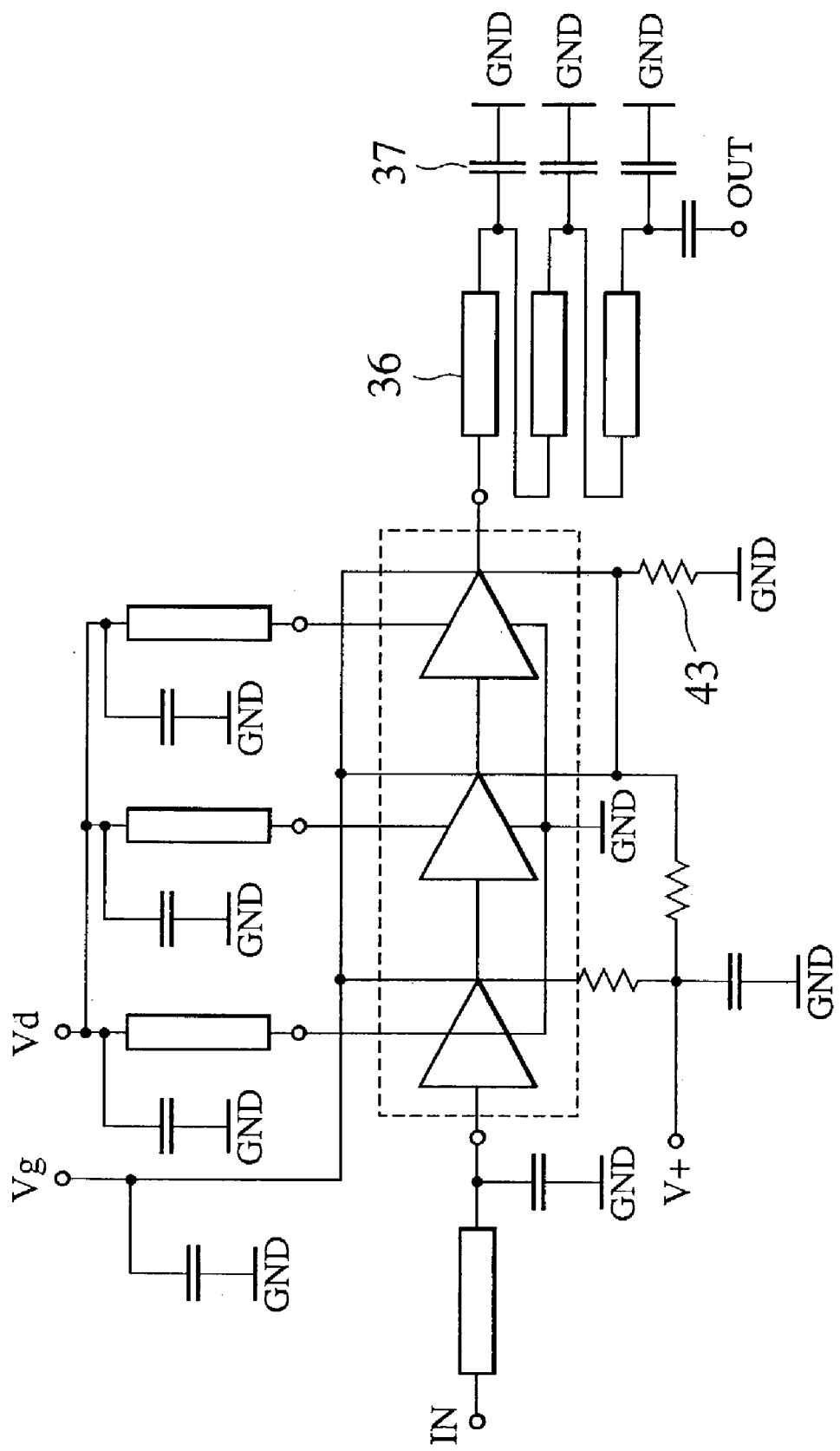
Figure 31:
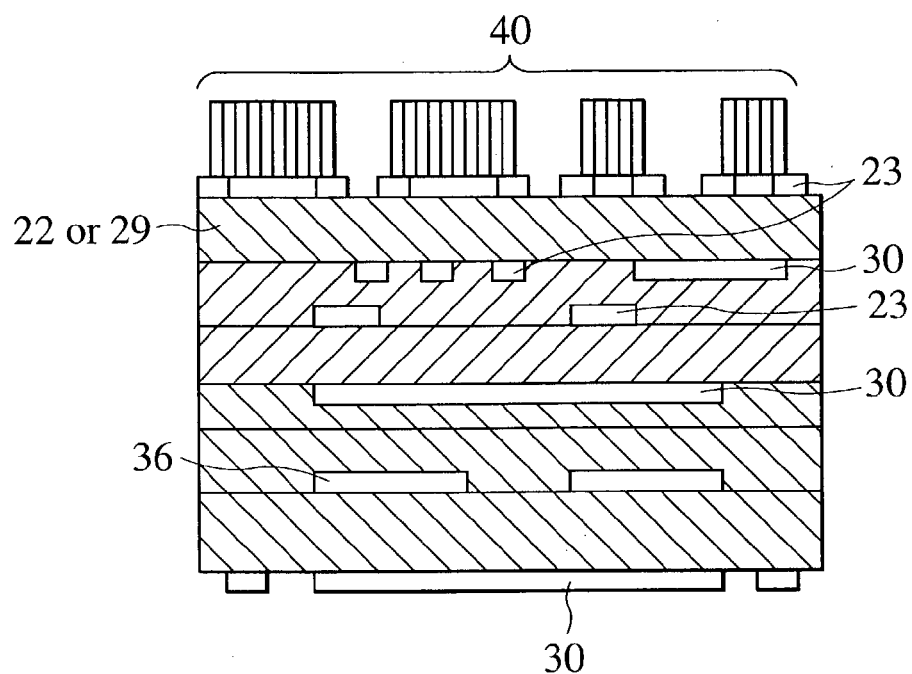
Figure 32:
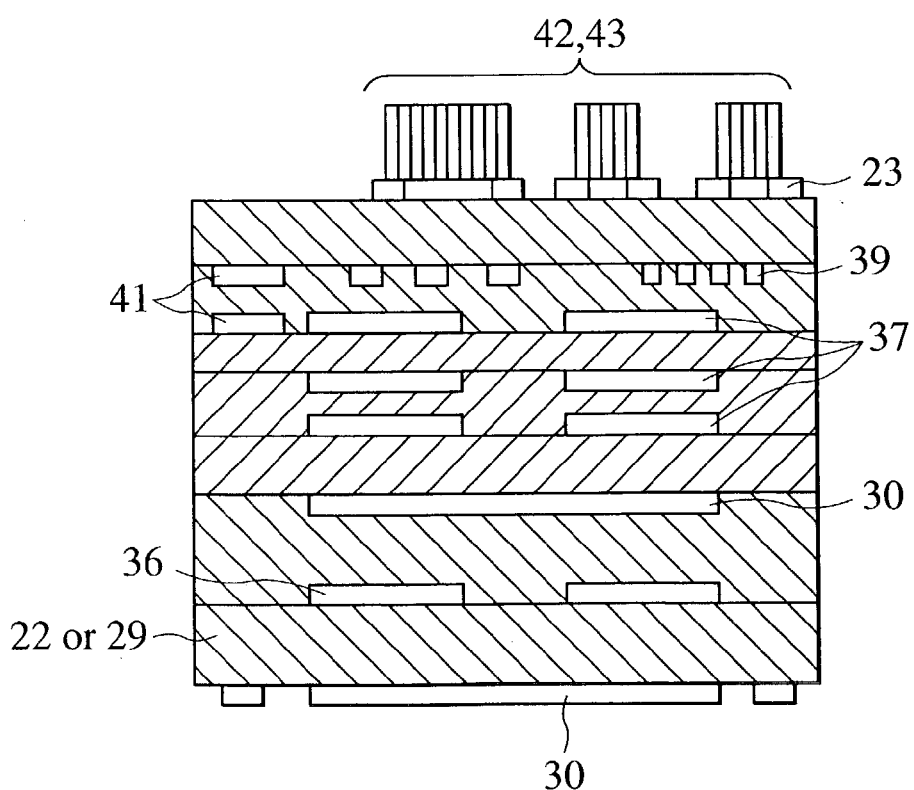

FIGS. 7A, 7B, and 7C are diagrams showing an example of the steps used in preparing a resin encapsulated type semiconductor device for high frequency signals according to the invention;

FIGS. 8A to 8G are diagrams showing an example of the steps used in preparing a resin encapsulated type semiconductor device for high frequency signals according to the invention;

FIGS. 9A to 9D are diagrams showing an example of the steps used in preparing a resin encapsulated type semiconductor device for high frequency signals according to the invention;

FIGS. 10A to 10D are diagrams showing in top, section and bottom views an example of the steps used in preparing an inductor according to the invention;

FIGS. 11A to 11E are diagrams showing in top, section and bottom views an example of the steps used in preparing a capacitor according to the invention;

FIG. 12 is a diagram which shows top, section and bottom views of a laminate plate forming a pulse transformer according to the invention;

FIG. 13 is a diagram which shows top, section and bottom views of a laminate plate forming a pulse transformer according to the invention;

FIG. 14 is a diagram which shows top, section and bottom views of a laminate plate forming a pulse transformer according to the invention;

FIG. 15 is a diagram which shows top, section and bottom views of a laminate plate forming a pulse transformer according to the invention;

FIG. 16 is a diagram which shows top, section and bottom views of a laminate plate forming a pulse transformer according to the invention;

FIG. 17 is a diagram which shows top, section and bottom views of a laminate plate forming a pulse transformer according to the invention;

FIG. 18 is a diagram which shows top, section and bottom views of a laminate plate forming a pulse transformer according to the invention;

FIG. 19 is an equivalent circuit diagram of a pulse transformer according to the invention;

FIG. 20 is a diagram which shows top, section and bottom views of a pulse transformer according to the invention;

FIG. 21 is an equivalent circuit diagram of a laminate filter according to the invention;

FIGS. 22A, 22B, and 22C are diagrams of constituent members of a laminate filter according to the invention;

FIGS. 23A to 22D are diagrams of constituent members of a coupler according to the invention;

FIG. 24 is a diagram showing top, section and bottom views of a coupler according to the invention;

FIG. 25 is an inner wiring diagram of a coupler according to the invention;

FIG. 26 is an equivalent circuit diagram of a coupler according to the invention;

FIGS. 27A to 27E are diagrams which shows in top, section and bottom views an example of the steps used for preparing an antenna according to the invention;

FIG. 28 is a sectional view of a voltage-controlled oscillator according to the invention;

FIG. 29 is a diagram showing an equivalent circuit of a voltage-controlled oscillator according to the invention;

FIG. 30 is a diagram showing an equivalent circuit of a power amplifier according to the invention;

FIG. 31 is a sectional view of a power amplifier according to the invention; and FIG. 32 is a sectional view of an RF module according to the invention.

DETAILED DESCRIPTION OF THE PREFERRED EMBODIMENTS

The present invention will be described more specifically. The electronic device of the invention is an electronic device for high frequency signals comprising conductor wiring for transmitting electric signals at 0.3 to 100 GHz and an insulating layer containing a crosslinked structure of the crosslinking ingredient represented by the general formula (I). An insulating layer having an extremely low dielectric constant and dielectric loss tangent can be formed by using a multi-functional styrene compound, not containing polar groups, as the crosslinking ingredient. Since the crosslinking ingredient has no volatility, variations of the characteristics in the insulating layer caused by evaporation does not occur as in divinyl benzene; and, accordingly, a low dielectric loss of the electronic device for high frequency signals can be obtained stably. The weight average molecular weight of the crosslinking ingredient (GPC, styrene-converted value) is preferably 1000 or less. This can improve the characteristics, such as lowering of the melting point of the crosslinking agent, an improvement in fluidity during molding, a lowering of the curing temperature and an improvement of the compatibility with various polymers, monomers and fillers, so as to obtain a low dielectric loss tangent resin composition that is excellent in fabricability. This can facilitate production of various forms of electric devices for high frequency signals. Preferred examples of the crosslinking ingredient can include, for example, 1,2-bis(p-vinylphenyl)ethane, 1,2-bis(m-vinylphenyl)ethane, 1-(p-vinylphenyl)-2-(m-vinylphenyl)ethane, 1,4-bis(p-vinylphenylethyl)benzene, 1,4-bis(m-vinylphenylethyl)benzene, 1,3-bis(p-vinylphenylethyl)benzene, 1,3-bis(m-vinylphenylethyl)benzene, 1-(p-vinylphenylethyl)-3-(m-vinylphenylethyl)benzene, bisvinylphenylmethane, 1,6-(bisvinylphenyl)hexane and vinylbenzene polymer (olygomer) having vinyl groups on the side chain.

The crosslinked material of the multi-functional styrene compound has an extremely low dielectric loss tangent; while, depending on the content of the impurity, the value of the dielectric loss tangent at 1 GHz is from 0.0005 to 0.0025. Thus, in the insulating layer of the electronic device for high frequency signals, according to the invention, the value for the dielectric loss tangent at 1 GHz can be adjusted to an extremely low value, such as 0.0005 to 0.0025, while the value of the dielectric loss tangent varies under the effect of other ingredients to be added.

In accordance with the invention, the insulating layer can be provided with strength, elongation, adhesion to the conductor wiring, and film forming performance by dispersing the high molecular weight material into the insulating layer. This makes it possible to manufacture a prepreg required for the preparation of a multi-layered wiring board and a laminate plate with a conductor foil prepared by laminating and curing, a conductor foil and a prepreg (hereinafter simply referred to as lamination board), as well as to enable manufacture of a high density multi-layered wiring substrate by a thin film forming process. The high molecular weight material has a molecular weight of, preferably, 5000 or more, more preferably, 10,000 to 100,000 and, further preferably, 15,000 to 60,000. An improvement in the mechanical strength is sometimes insufficient in a case where the molecular amount is small, whereas the viscosity increases upon forming the resin composition into a varnish, making it difficult to carry out mixing and stirring, and film formation, in a case where the molecular weight is excessively large. Examples of the high molecular weight material can include homo- or co-polymers of monomers selected from butadiene, isoprene, styrene, ethylstyrene, dibinylbenzene, N-vinylphenyl maleimide, acrylate and acrylonitrile, and polyphenylene oxide, cyclic polyolefin, polysiloxane and polyether imide, which may have a substituent. Among them, polyphenylene oxide and cyclic polyolefin are preferred, since they have high strength and low dielectric loss tangent.

The invention includes an electronic device for high frequency signals having an insulating layer in which various insulators of different dielectric constants are dispersed in the crosslinking ingredient. This constitution can control the dielectric constant easily, while suppressing an increase in the dielectric loss tangent of the insulating layer. In the resin composition of the invention, the dielectric constant at 1 GHz can be controlled within a range of about 2.3 to 3.0 depending on the kind and the addition amount of the high molecular weight material to be blended. Further, in the electronic device of high frequency signals, in which low dielectric constant insulators with a dielectric constant at 1 GHz of 1.0 to 2.2 are dispersed in the insulating layer, the dielectric constant of the insulating layer can be controlled to about 1.5 to 2.2. A decrease in the dielectric constant of the insulating layer can permit higher-speed transmission of electronic signals. This is because the transmission speed of the electric signals is in a proportional relationship with a reciprocal of the square root of the dielectric constant, and the transmission speed is higher as the dielectric constant of the insulating layer is lower. For a low dielectric constant insulator, low dielectric constant resin particles, hollow resin particles, hollow glass balloons and gaps (air) are preferred, and the particles, preferably, are from 0.2 to 100 μm and, more preferably, 0.2 to 60 μm on the average, in view of the strength and the insulation reliability of the insulating layer. Examples of the dielectric constant resin particles can include polytetrafluoroethylene particles, polystyrene-divinyl benzene crosslinked particles and the hollow particles can include hollow styrene-divinyl benzene crosslinked particles, silica balloon, glass balloons and silas balloons.

The low dielectric constant insulating layer is suitable for an encapsulation resin for semiconductor devices requiring a high speed transmission property, for wiring of MCM substrates for electrically connecting chips and for formation of circuits, such as high frequency chip inductors.

On the other hand, electronic devices for high frequency signals having high dielectric insulating layers with a dielectric constant of 3.1 to 20 can be prepared while suppressing an increase in the dielectric loss tangent by dispersing a high dielectric constant insulator, with a dielectric constant at 1 GHz of 3.0 to 10,000, in the insulating resin of the invention. An increase in the dielectric constant of the insulating layer can reduce the size of the circuits and increase the capacitance of the capacitors, and it can contribute to the size-reduction of the electronic devices for high frequency signals. The high dielectric constant low dielectric loss tangent insulating film is suitable to formation of capacitors, inductors, filters and antennas for resonance circuits. The high dielectric constant insulator used in accordance with the invention can include ceramic particles or metal particles subjected to insulation treatment. Specifically, they can include silica, alumina, zirconia and ceramic particles, for example, high dielectric constant insulators such as of $MgSiO_4$, $Al_2O_4$, $MgTiO_3$, $ZnTiO_3$, $ZnTiO_4$, $TiO_2$, $CaTiO_3$, $SrTiO_3$, $SrZrO_3$, $BaTi_2O_5$, $BaTi_4O_9$, $Ba_2Ti_9O_{20}$, $Ba(Ti,Sn)_9O_{20}$, $ZrTiO_4$, $(Zr,Sn)TiO_4$, $BaNd_2Ti_5O_{14}$, $BaSmTiO_{14}$, $Bi_2O_3$—$BaO$—$Nd_2O_3$—$TiO_2$ system, $La_2Ti_2O_7$, $BaTiO_3$, $Ba(Ti,Zr)O_3$ system, and $(Ba,Sr)TiO_3$ system, as well as fine metal particles applied with insulation treatment, for example, gold, silver, palladium, copper, nickel, iron, cobalt, zinc, Mn—Mg—Zn system, Ni—Zn system, Mn—Zn system, carbonyl iron, Fe—Si system, Fe—Al—Si system, and Fe—Ni system. The particles of the high dielectric constant insulator are prepared by a pulverizing and pelleting method, or a spraying heat decomposing method of preparing fine metal particles by spray and heat treatment of thermally decomposing metal compounds (Japanese Patent Publication No. 63-31522, Japanese Patent Laid-open Nos.

6-172802 and 6-279816). In the spray heat decomposing method, metal particles having an insulating layer on the surface can be formed by mixing a metal compound as a starting material, for example, carboxylates, phosphate or sulfate, with boric acid, silicic acid or phosphoric acid that reacts with a formed metal into ceramics, or various kinds of metal salts which are formed into ceramics after oxidation and applying spray heat decomposing treatment. The average grain size of the high dielectric constant insulator is preferably about 0.2 to 100 μm and an average particle size from 0.2 to 60 μm is further preferred from a view point of the strength of the insulating layer and the insulation reliability. Kneading with the resin composition is difficult as the grain size is smaller, while dispersion is not uniform when the grain size is excessively large to form initiation points for insulation breakdown and sometimes results in lowering of the insulation reliability. The high dielectric particles may be of any shape, such as spherical form, pulverized form or whisker form.

The content of the low dielectric constant insulator or high dielectric constant insulator is, preferably, 10 to 80% by volume and, more preferably, 10 to 65% by volume, based on the total amount of the crosslinking ingredient, the high molecular material ingredient and the low dielectric constant insulator or high dielectric constant insulator. At a lower content, control of the dielectric constant is difficult; and, on other hand, at a higher content, it may sometimes cause lowering of the insulation reliability and lowering of the fabricability of the insulating layer. Within the range of the content described above, the dielectric constant can be controlled to a desired level.

Further, in accordance with the invention, the low dielectric loss tangent resin composition may be impregnated in glass cloth formed by knitting various kinds of glass fibers, such as H glass, E glass, NE glass or D glass, or various kinds of non-woven fabrics, such as aramide non-woven fabric or LPC non-woven fabric and then curing them. The glass cloth and the non-woven fabric contribute to the control of the dielectric constant of the insulating layer, as well as enhance the strength of the insulating layer before and after curing of the insulating layer.

In accordance with the invention, a flame retardant may be dispersed in the insulating layer for the purpose of enhancing the safety of the electronic device for high frequency signals. There is no particular restriction on the kind of flame retardant to be used; and, when importance is attached to the low dielectric loss tangent, it is preferred to use the red phosphor particles and organic flame retardants specified in the following general formulae (II)–(VI). This can effectively make the low dielectric loss tangent and the flame retardancy of the insulating layer compatible, thereby to ensure the safety of the electronic device for high frequency signals against fire.

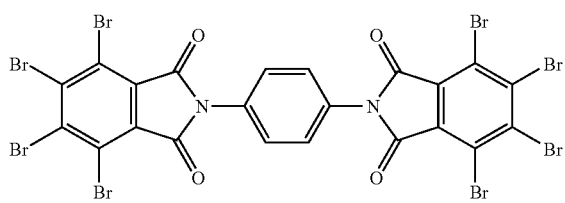

(II)

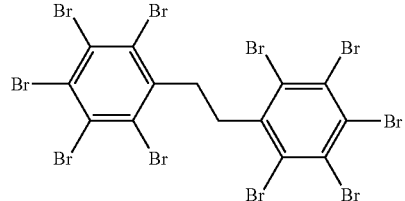

(III)

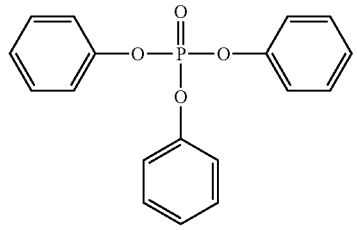

(IV)

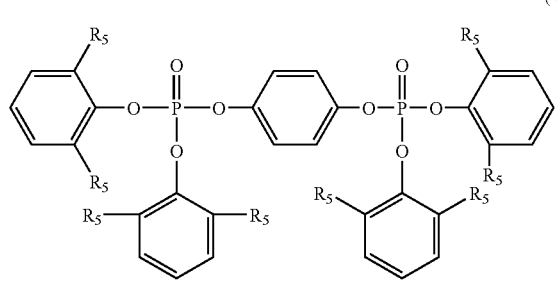

(V)

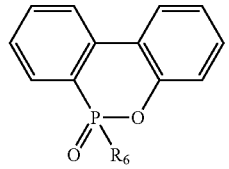

(VI)

(where $R_5$, $R_6$ each represents hydrogen, or an identical or different organic residue of 1 to 20 carbon atoms).

The amount of the flame retardant to be blended in accordance with the invention is preferably within a range from 1 to 100 parts by weight, and, further preferably, within a range from 1 to 50 parts by weight, based on 100 parts by weight for the total amount of the crosslinking agent, the high molecular weight material and other organic ingredients forming the insulating layer. It is preferred to control the blending amount within the range described above, depending on the flame retarding effect of the flame retardant. The dielectric loss tangent may sometimes be deteriorated when the amount of flame retardant is excessively large, whereas no sufficient flame retardancy can sometimes result when the amount of the flame retardant is insufficient. Further, to improve the flame retardancy, antimony type compounds, such as antimony trioxide, antimony tetraoxide, antimony pentaoxide, and sodium antimonate, or nitrogen-containing compounds, such as melamine, triallyl-1,3,5-triazine-2,3,4-(1H, 3H, 5H)-trione, and 2,4,6-triallyloxy1,3,5-triazine, may be added as a flame retardant aid.

In accordance with the present invention, a general-purpose curing resin may be added as a second crosslinking agent within a permissible range in view of the dielectric characteristics. Examples of the general purpose curing resin can include phenolic resin, epoxy resin, cyanate resin, vinyl benzyl ether resin and crosslinkable polyphenylene oxide. Since the general-purpose thermosetting resin has polar groups in the molecule, the adhesion between the conductor wiring and the insulating layer and the mechanical strength of the insulating layer can be improved.

In accordance with the invention, a wiring substrate having both a low dielectric constant insulating layer and a high dielectric constant insulating layer together can be prepared by combining the low dielectric constant insulating layer and the high dielectric constant insulating layer in accordance with the required characteristics of a circuit. A plurality of insulating layers of different electric constants may be present in one identical plane, or they may be present on every layer in a multi-layered structure. This can make the size reduction of the electronic device and higher speed transmission characteristics compatible to each other.

The electronic devices according to the present invention will be described, based on the characteristics required for each of electronic devices.

(1) Semiconductor Device

Figure 1:
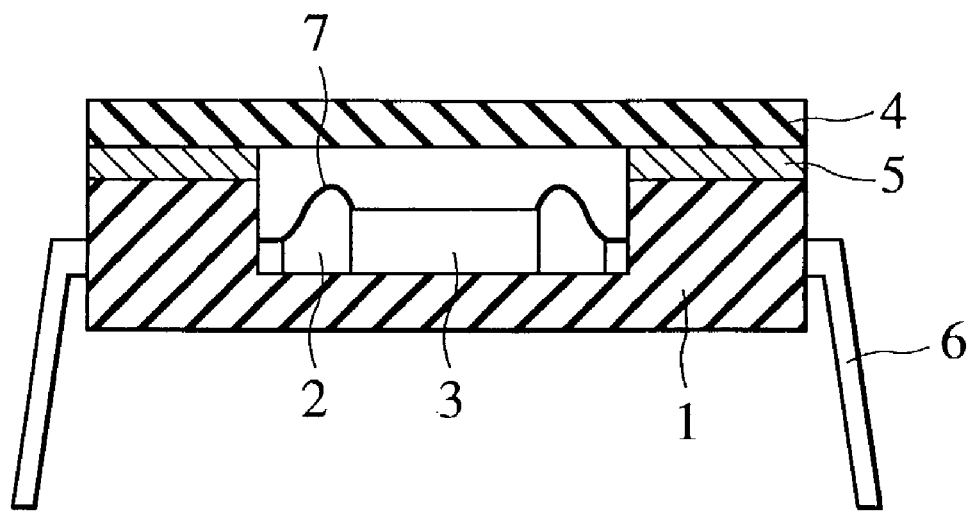
FIG. 1 is a cross-section which shows an example of the structure of an existent semiconductor device for high frequency signals.

Heretofore, a semiconductor device for a high frequency signal has been manufactured as a hermetically sealed type of airtight package using an air layer as an insulating layer, as shown in FIG. 1, in order to reduce the capacitance between the wiring that impedes a high frequency operation. In accordance with the invention, a semiconductor device that is insulated and protected with a low dielectric constant and low dielectric loss tangent resin layer is manufactured by mixing and dispersing a low dielectric constant and low dielectric tangent resin composition containing a crosslinking agent represented by the general formula (I), low dielectric constant insulator particles and, optionally, a high molecular weight material, a flame retardant, a second crosslinking agent, a releasing agent and a colorant at a predetermined blending ratio in an organic solvent or in a solvent-less state, covering the semiconductor chip with the low dielectric constant low dielectric loss tangent resin composition and, optionally, drying and curing the same. The low dielectric constant, low dielectric loss tangent resin composition can be cured by heating at 120 to 240° C.

Figure 2:
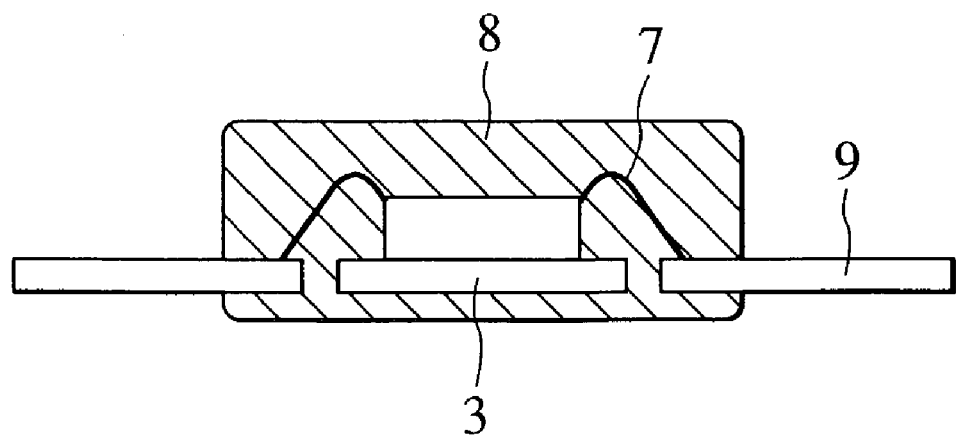
FIG. 2 is a cross-section which shows an example of the structure of a semiconductor device for high frequency signals according to the invention.

FIG. 2 shows an example of a semiconductor device for high frequency signals in accordance with the invention, in which there is no particular restriction on the shape thereof. According to the invention, a highly efficient semiconductor device for high frequency signals having a high transmission speed and a low dielectric loss can be manufactured by an inexpensive die molding method. The method of forming the low dielectric constant, low dielectric loss tangent insulating layer of the invention can include, for example, transfer pressing or potting, which may be selected properly depending on the shape of the semiconductor device. There is no particular restriction on the form the semiconductor device, and it can include, for example, a tape carrier type package or a semiconductor device in which a semiconductor chip is bare chip mounted on a wiring substrate.

(2) Multi-layered Substrate

The crosslinking ingredient represented by the general formula (I) has a lower dielectric loss tangent compared with the existent thermosetting resin compositions. Accordingly, the wiring substrate using the crosslinking ingredient for the insulating layer provides a wiring substrate that has excellent high frequency characteristics with less dielectric loss. A method of preparing the multi-layered wiring substrate will be described below.

In accordance with the invention, a prepreg or a conductor foil with an insulating layer as a starting material for the multi-layered wiring substrate is prepared by kneading a low dielectric loss tangent resin composition containing a crosslinking ingredient represented by the general formula (I), a high molecular weight material, optionally, low dielectric constant insulator particles or high dielectric constant insulator particles, a flame retardant, a second crosslinking ingredient blended at a predetermined blending ratio into the slurry and then coating and drying the same on a substrate, such as one made of glass cloth, non-woven fabric or conductor foil. The prepreg can be used as a core material for a lamination plate, or as an adhesive layer and an insulating layer for a lamination plate and a lamination plate or a conductor foil. On the other hand, the conductor foil with an insulating layer is used when a conductor layer is formed on the surface of a core material by lamination or pressing. The core material in accordance with the invention is a substrate for carrying and reinforcing the conductor foil with an insulating layer. In addition, examples of the core material include glass cloth, non-woven fabric, film material, a ceramic substrate, a glass substrate, a general-purpose resin plate, such as one made of epoxy, and a general-purpose lamination plate. The solvent used for slurrification is preferably a solvent for the crosslinking ingredient, the high molecular weight material, the flame retardant, etc. to be blended. In addition, examples of the solvent include dimethylformamide, methyl ethyl ketone, methyl isobutyl ketone, dioxane, tetrahydrofuran, toluene and chloroform. The condition for drying the prepreg or the conductor foil with an insulating layer (B stage) is controlled depending on the solvent used and the thickness of the resin layer that is coated. For example, in a case of forming an insulating film of about 50 μm in dry thickness by using toluene, it may be dried at 80 to 130° C. for 30 to 90 min. The thickness of a preferred insulating layer is 50 to 300 μm, which is optionally controlled depending on the uses or required characteristics (such as wiring pattern size and DC resistance).

Figure 3A:
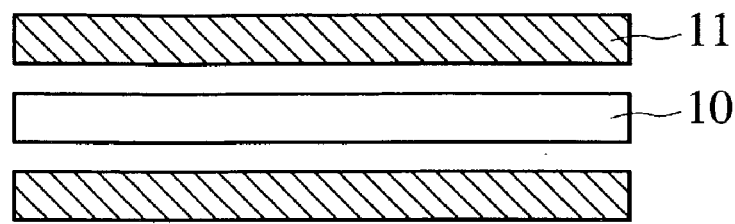
FIGS. 3A to 3E are diagrams showing an example of the steps used in preparing a multi-layered wiring substrate according to the invention.
Figure 3B:
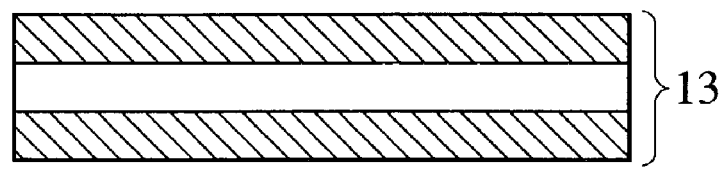

An example of preparing a multi-layered wiring substrate is shown below. A first example is shown in FIGS. 3A to 3E. In FIG. 3A, a prepreg 10 of a predetermined thickness is stacked with conductor foils 11. The conductor foil used is optionally selected from those having a preferred conductivity, such as gold, silver, copper and aluminum. For the surface shape, a foil of large unevenness is used in a case where it is necessary to increase the adhesion with the prepreg, and a foil having a relatively smooth surface is used when it is necessary to further improve the high frequency characteristics. The thickness of the conductor foil is, preferably, about 9 to 35 μm from the view point of etching fabricability. In FIG. 3B, the prepreg and the conductor foils are bonded and cured by pressing while heating them under press bonding to obtain a laminate plate 13 having conductor layers on the surfaces. The heating conditions are preferably at 120 to 240° C., 1.0–5 MPa and for 1 to 3 hours. Further, the temperature and pressure used in the pressing may be in a multi-stage within the range described above. The laminate plate obtained according to the invention exhibits excellent high frequency transmission characteristics due to the extremely low dielectric loss tangent of the insulating layer.

Figure 3C:
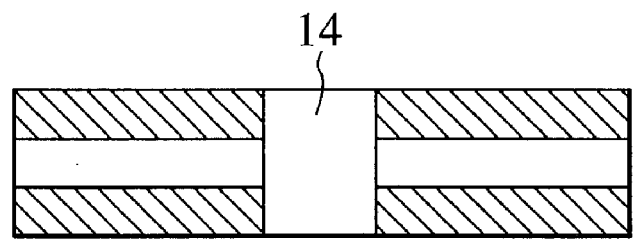
Figure 3D:
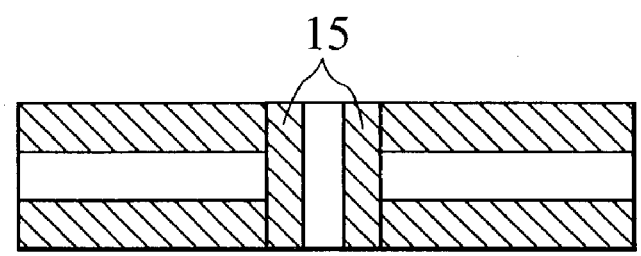
Figure 3E:
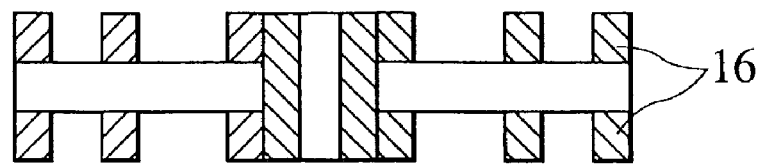

An example of preparing double face wiring substrate will be described. In FIG. 3C, a through hole 14 is bored by drilling at a predetermined position of the laminate formed previously. In FIG. 3D, a plating film 15 is applied to the through hole by plating to electrically connect the respective conductor foils on the front face and the rear face. In FIG. 3E, the conductor foils on both surfaces are patterned to form conductor wirings 16.

Figure 4A:
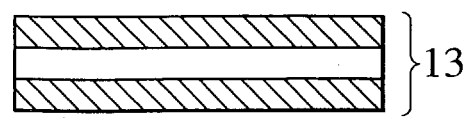
FIGS. 4A to 4G are diagrams showing an example of the steps used in preparing a multi-layered wiring substrate according to the invention.
Figure 4B:
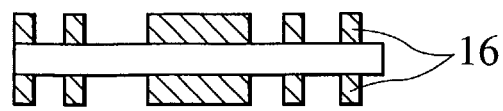
Figure 4C:
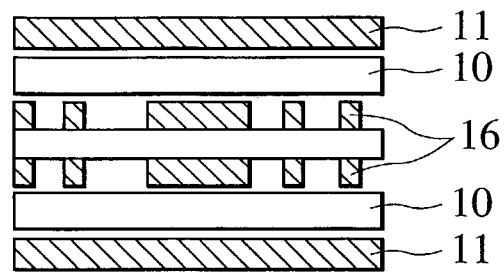
Figure 4D:
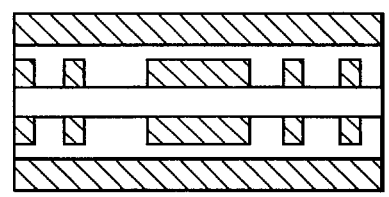
Figure 4E:
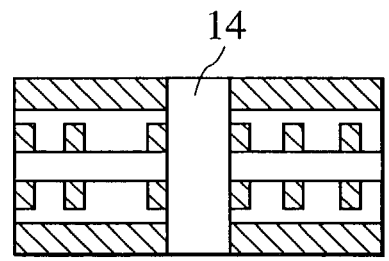
Figure 4F:
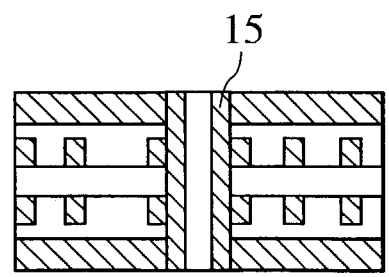
Figure 4G:
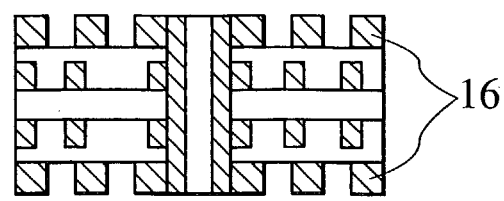

An example of how a multi-layered wiring substrate is prepared will be described. In FIG. 4A, a laminate plate 13 is prepared by using a prepreg of a predetermined thickness and conductor foils. In FIG. 4B, a conductor wiring 16 is formed on both surfaces of the laminate plate. In FIG. 4C, prepregs 10, each having a predetermined thickness, and conductor foils 11 are stacked on the laminate plate on which the pattern has been formed. In FIG. 4D, conductor foils are formed as outer layers by heating and pressing. In FIG. 4E, a through hole 14 is bored by drilling at a predetermined position. In FIG. 4F, a plating film 15 is applied to the through hole to electrically connect the outer layers. In FIG. 4G, patterning is applied to the conductor foils serving as the outer layers to form conductor wirings 16.

Figure 5A:
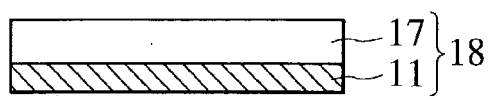
FIGS. 5A to 5I are diagrams showing an example of the steps used in preparing a multi-layered wiring substrate according to the invention.
Figure 5B:
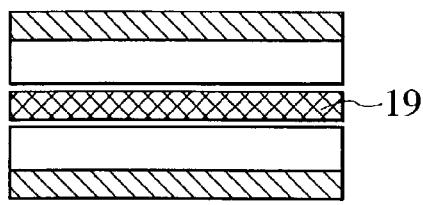
Figure 5C:
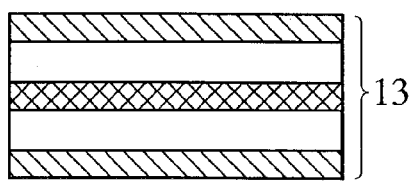
Figure 5D:
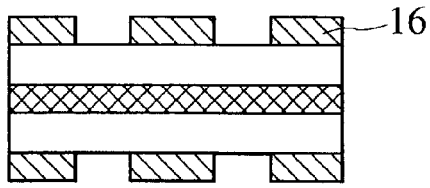
Figure 5E:
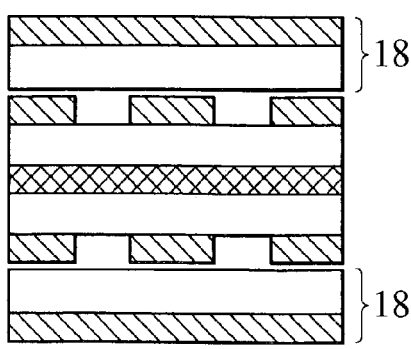
Figure 5F:
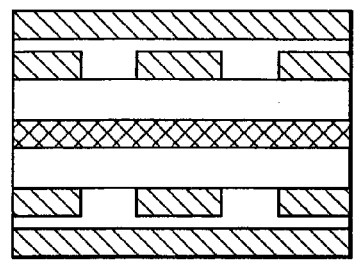
Figure 5G:
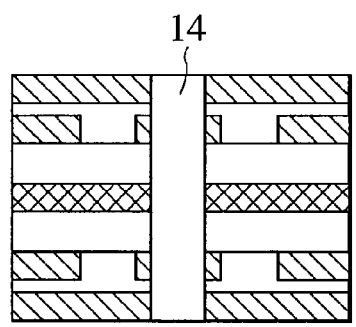
Figure 5H:
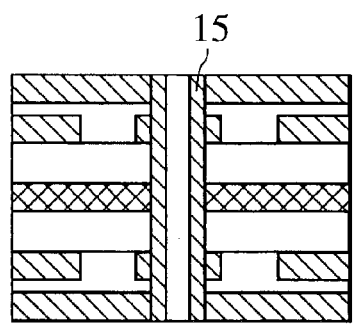
Figure 5I:
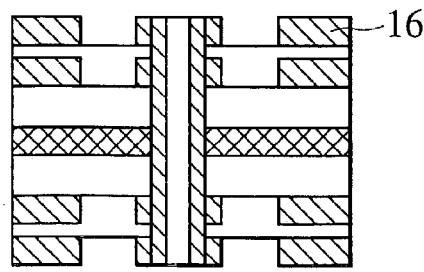

An example of how a multi-layered wiring substrate is prepared using a copper foil with an insulating layer is shown in FIGS. 5A to 5I. In FIG. 5A, a varnish of a resin composition in accordance with the invention is coated on the conductor foil 11 and dried to form a conductor foil 18 with an insulating layer having a not-cured insulating layer 17. In FIG. 5B, a lead terminal 19 and conductor foils 18 with insulating layers are stacked. In FIG. 5C, the lead terminal 19 is bonded to the conductor foils 18 with insulating film by pressing to form a laminate film 13. Adhesion between the core material and the insulating layer can be improved by previously applying coupling or roughening treatment to the surface of the core material. In FIG. 5D, the conductor foils 11 of the laminate plate 13 are patterned to form conductor wiring 16. In FIG. 5E, conductor foils 18 with an insulating layer are stacked on the laminate plate 13 formed with wiring. In FIG. 5F, the laminate plate 13 is bonded to the conductor foils 18 with insulating film by pressing. In FIG. 5G, a through hole 14 is bored at a predetermined position. In FIG. 5H, a plating film 15 is applied to the hole 14. In FIG. 5I, the conductor foils 11 serving as the outer layer are patterned to form conductor wirings 16.

Figure 6A:
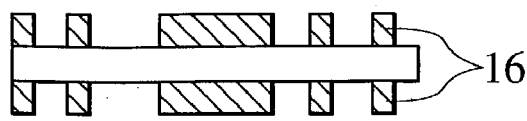
FIGS. 6A to 6F are diagrams showing an example of the steps used in preparing a multi-layered wiring substrate according to the invention.
Figure 6B:
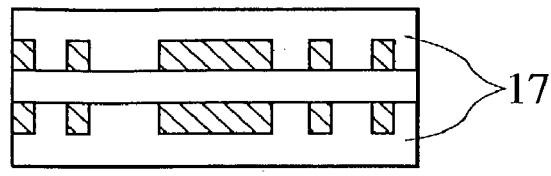
Figure 6C:
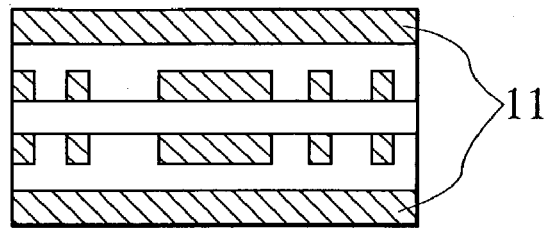
Figure 6D:
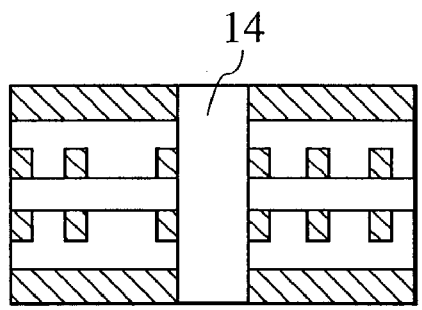
Figure 6E:
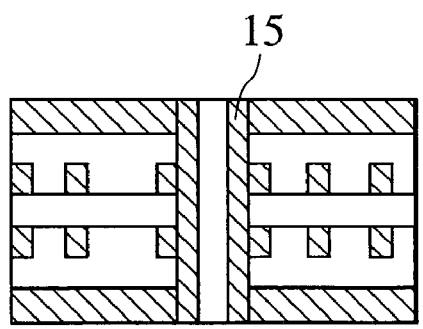
Figure 6F:
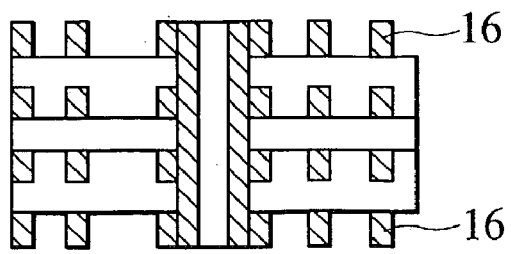

An example of how a multi-layered substrate is prepared by screen printing is shown in FIGS. 6A to 6F. In FIG. 6A, conductor foils of a laminate plate 13 are patterned to form conductor wirings 16. In FIG. 6B, a varnish of the resin composition in accordance with the invention is coated by screen printing and dried to form insulating layers 7. In this step, insulating layers having different dielectric constants can be formed in one identical plane of the insulating layers 17 by coating resin compositions of different dielectric constants partially by screen printing. In FIG. 6C, conductor foils 11 are stacked on the insulating layers and bonded by pressing. In FIG. 6D, a through hole 14 is bored at a predetermined position. In FIG. 6E, a plating film 15 is applied to the through hole. In FIG. 6F, conductor foils 11 serving as the outer layers are patterned to form conductor wirings 16.

In accordance with the invention, various wiring substrates may be formed, and so that the invention is not restricted to the examples described above. For example, a plurality of laminate plates to which a wiring formation has been applied can be collectively laminated by way of prepregs into a multi-layered structure at higher order, or a build-up multi-layered wiring substrate in which layers are electrically connected to each other by blind via holes formed by laser fabrication or dry etching fabrication can also be prepared. In the manufacture of the multi-layered wiring substrate, the dielectric constant and the dielectric loss tangent for each of the insulating layers can be selected optionally, and insulating layers of different characteristics are provided together and can be combined in accordance with a particular purpose, such as low dielectric loss, high-speed transmission, size reduction and reduction of cost.

An electronic device for high frequency signals with low dielectric loss and which has excellent high frequency characteristics can be obtained by using the low dielectric loss tangent resin composition of the invention as an insulating layer. Further, electronic devices of high performance for high frequency signals having various functions can be obtained by incorporating a device pattern in the conductor wiring by the method of preparing the multi-layered wiring substrate described above. In an example, a multi-layered wiring substrate having at least one function of that of a capacitor, inductor and antenna can be manufactured. Further, pulse transformer circuits, filter circuits, couplers, voltage controlled oscillators, power amplifiers and RF modules can be produced by optional combination with various kinds of parts to be mounted.

EXAMPLES

The electronic device of the present invention will be described on the basis of necessary characteristics as required for each of example of the electronic devices.

Tables 1 and 2 show the compositions of the resin compositions used in accordance with the invention and the characteristics thereof. The compositional ratio indicated in the tables represents the weight ratio. The name and the method of synthesis of the reagents used in the examples and the method of preparation of the varnish and a method of evaluation of the curing products will be described.

(1) Synthesis of 1,2-bis(vinylphenyl)ethane (BVPE)

BVPE or 1,2-bis(vinylphenyl)ethane was synthesized by a known method as described below. Granular magnesium for a Grignard reaction (manufactured by Kanto Chemical) of 5.36 g (220 mmol) in weight was taken into a 500 ml three-necked flask, to which a dropping funnel, a nitrogen introduction tube and a septum cap were attached. Under a nitrogen gas stream, the entire system was heated and dewatered by a drier while stirring the magnesium particles with a stirrer. 300 ml of dry tetrahydrofuran was taken in a syringe and injected through the septum cap. After cooling the solution to −5° C., 30.5 g (200 mmol) of vinylbenzyl chloride (VBC, manufactured by Tokyo Kasei Kogyo, Co., Ltd.) was dropped for about 4 hours using the dropping funnel. After the end of the dropping process, stirring was continued at 0° C. for 20 hrs. After the completion of the reaction, the reaction solution was filtered to remove residual magnesium, and then the filtrate was concentrated by an evaporator. The concentrated solution was diluted with hexane and washed once with an aqueous 3.6% solution of hydrochloric acid and three times with purified water and then dehydrated by magnesium sulfate. The dewatered solution was purified by passing it through a silica gel (Wako Gel C300, manufactured by Wako Pure Chemical Industries, Ltd.)/hexane short column, and it was dried under vacuum to obtain BVPE. The obtained BVPE was a mixture of m-m form (liquid), m-p form (liquid), and p-p form (crystal), and the yield was 90%. When the structure was examined by $^1$H-NMR, the values agreed with the literature values (6H-vinyl: α-2H, 6.7, β-4H, 5.7, 5.2; 8H-aromatic: 7.1–7.35: 4H-methylene: 2.9).

The BVPE described above was used as a crosslinking ingredient.

(2) Other Reagent

The following were used as other high molecular weight materials and a crosslinking ingredient.

High molecular weight material:
  PPE: poly-2,6-dimethyl-1,4-phenyleneoxide, manufactured by Sigma-Aldrich Co.
  PBD: poly-1,4-butadiele; liquid high molecular weight material, manufactured by Sigma-Aldrich Co.
  StBu: Styrene-butadiene copolymer, manufactured by Sigma-Aldrich Co.

Curing catalyst:
  25B: 2,5-dimethyl-2,5-bis(t-butylperoxy)hexine-3 (Perhexine 25B), manufactured by NOF CORPORATION Flame retardant:
  Hishiguard: red phorphorous particles (Hishiguard TP-A10) average particle size 20 μm, manufactured by Nippon Chemical Industrial CO., LTD.

Organic non-woven fabric:
  Vectran MBBK (about 50 μm in thickness), manufactured by KURARAY CO., LTD.

Low dielectric constant insulator:
  Z-36: Borosilicate glass balloon (average particle size 56 μm), manufactured by TOKAI KOGYO CO., LTD.

High dielectric constant insulator:
  Ba-Ti series: Barium titanate series inorganic filler having a dielectric constant of 70 at 1 GHz, a density of 5.5 $g/cm^3$, and an average grain size of 1.5 μm (3) Method of Preparation of Varnish A resin composition formulated to a predetermined amount of composition was mixed and dispersed with chloroform or in a solventless state to prepare a varnish of the resin composition.

(4) Preparation of Resin Plate

The varnish containing the solvent described above was coated on a PET film, dried and then peeled, and this was placed by a predetermined amount in a spacer made of polytetrafluoroethylene (hereinafter simply referred to as PTFE), following which it was heated and pressed under vacuum by way of a polyimide film and a mirror plate to obtain a resin plate as a curing product. Multi-stage heating was applied under the heating conditions of 120° C./30 min, 150° C./30 min, 180° C./100 min at a pressing pressure of 1.5 MPa. The resin plate measured 70×70×1.5 mm.

The solventless varnish was cast into a spacer made of PTFE and cured in a nitrogen gas stream under the heating conditions of 120° C./30 min, 150° C./30 min and 180° C./100 min to obtain a resin plate. The resin plate measured 70×70×1.5 mm.

(5) Preparation of Prepreg

All the prepregs manufactured in the examples were prepared by impregnating the varnish of the resin composition to a predetermined organic non-woven fabric, which was then dried at room temperature for about one hour and at 90° C. for 60 min.

(6) Preparation of Prepreg Curing Product

To determine the characteristics of the prepreg when formed into the laminate plate, the prepreg manufactured by the method described above was heated and pressed under vacuum conditions to prepare a simulated substrate. Multi-stage heating was applied under the heating conditions of 120° C./30 min, 150° C./30 min, and 180° C./100 min at a pressing pressure of 1.5 MPa. The simulated substrate measured 70×70×1.5 mm.

(7) Measurement of Dielectric Constant and Dielectric Loss Tangent

The dielectric coefficient and the dielectric loss tangent were observed as values at 1 GHz, using a cavity resonation method (Model 8722ES network analyzer manufactured by Agilent Technologies, cavity resonator manufactured by KANTOH EAD INC.)

(8) Flame Retardancy

Flame retardancy was evaluated in accordance with UL-94 standards using a specimen of a sample size of 70×3×1.5 $mm^3$.

TABLE 1

|  | Example 1 | Example 2 | Example 3 | Example 4 | Example 5 | Example 6 | Example 7 |
|---|---|---|---|---|---|---|---|
| BVPE | 50 | 50 | 50 | 50 | 50 | 50 | 50 |
| PPE | 50 | 50 | 50 | 50 | 50 | 50 | 50 |
| 25B | 0.5 | 0.5 | 0.5 | 0.5 | 0.5 | 0.5 | 0.5 |
| Ba—Ti system | 0 | 0 | 0 | 0 | 110 | 440 | 880 |
| Z36 | 0 | 0 | 10 | 20 | 0 | 0 | 0 |
| Hishi-guard* | 0 | 5 | 5 | 5 | 5 | 5 | 5 |
| Dielec-tric constant | 2.5 | 2.6 | 2.2 | 1.8 | 4.9 | 12.9 | 16 |
| Dielec-tric loss tangent | 0.0008 | 0.0011 | 0.0012 | 0.0013 | 0.0015 | 0.0025 | 0.004 |
| Flame retard-ancy | none | V0 | V0 | V0 | V0 | V0 | V0 |
| Remark | Low ε, low tan δ | Low ε, low tan δ | Low ε, low tan δ | Low ε, low tan δ | High ε, low tan δ | High ε, low tan δ | High ε, low tan δ |

*Hishiguard (trade name; Nippon Chemical Industrial Co., Ltd.)

TABLE 2

|  | Example 8 | Example 9 | Example 10 | Example 11 |
| --- | --- | --- | --- | --- |
| BVPE | 50 | 50 | 50 | 70 |
| PPE | 50 | 50 | 20 | 0 |
| StBu | 0 | 0 | 30 | 0 |
| PBD | 0 | 0 | 0 | 30 |
| 25B | 0.5 | 0.5 | 0.5 | 0.5 |
| Ba—Ti system | 0 | 440 | 0 | 0 |
| Z36 | 10 | 0 | 10 | 10 |
| Non-woven fabric | 50 | 15 | 0 | 0 |
| Dielectric constant | 2.2 | 12 | 2 | 1.8 |
| Dielectric loss tangent | 0.0015 | 0.0025 | 0.002 | 0.002 |
| Remark | Low ε, pre-preg | High ε, pre-preg | For molding | For potting |

Example 1

Example 1 is an example of an insulating layer for an electronic device for high frequency signals in accordance with the present invention. Since BVPE as a multi-functional styrene compound is used for the crosslinking ingredient, it has an extremely low dielectric constant and dielectric loss tangent. An electronic device for high frequency signals with less dielectric loss can be manufactured by forming the insulating layer using the resin composition of the invention.

Example 2

Example 2 is a resin composition formed by adding red phosphorus particles as a flame retardant to Example 1. The resin composition can be made flame-retardant by the addition of the flame retardant, thus improving the safety of the electronic device for high frequency signals.

Examples 3 and 4

Examples 3 and 4 are examples of adding glass balloon (Z36) as the low dielectric constant insulator to the resin composition of Example 2. The dielectric constant was lowered from 2.6 to 1.8 along with an increase in the amount of added Z36. The electronic device for high frequency signals using the resin composition for the insulating layer shows less dielectric loss and enhances the high-speed transmission property.

Examples 5 to 7

In examples 5 to 7, ceramic particles (Ba—Ti system) were added as a high dielectric constant insulator to the resin composition of Example 2. A dielectric constant increased to 2.6–16 along with an increase in the content of the Ba—Ti system. The electronic device for high frequency signals using the resin composition as the insulating layer provides a small-sized electronic device for high frequency use having less dielectric loss.

Example 8

Example 8 is a prepreg using an organic non-woven fabric as a base material, and it is prepared such that the resin content is 50 wt %. This prepreg can be stacked and bonded with copper foils to form a lamination plate. Further, it can be used as an adhesive layer between lamination plates. Since the insulating layer, that is prepared by using the prepreg of this example, exhibits a low dielectric constant and low dielectric loss tangent, an electronic device for high frequency signals with-high speed transmission and low dielectric loss can be manufactured.

Example 9

Example 9 is a prepreg using an organic non-woven fabric as a base material, and it is prepared such that the resin content is 15 wt %. This prepreg can be laminated and bonded with copper foils to form a lamination plate. Further, it can be used as an adhesive layer between lamination plates. Since the insulating layer prepared by using a prepreg of this example exhibits a high dielectric constant, the size of the circuit can be reduced; and, since the dielectric loss tangent is low, an electronic device for high frequency use with low dielectric loss can be manufactured.

Example 10

Example 10 is an example of a thermosetting molding resin composition.

Various molding products can be fabricated by using the composition of this example. Since the curing products of the resin composition have a low dielectric constant and a low dielectric loss tangent, an electronic device having an insulating layer formed from this composition can provide an electronic device for high frequency signals having a high speed transmission property and a low dielectric loss property.

Example 11

Example 11 is a liquid resin composition forming a low dielectric constant, low dielectric loss tangent curing product. The liquid resin composition can be cast at a normal temperature and at a low pressure. Further, since an electronic device for high frequency signals having an insulating film prepared from the resin composition of the invention has a low dielectric constant and a low dielectric loss tangent, it can provide an electronic device for high frequency signals that has a high-speed transmission property and a low dielectric loss property.

According to the invention, an electronic device for high frequency signals with excellent transmission characteristics can be produced by using various kinds of the low dielectric loss tangent resin compositions described above. Since the insulating layer formed of the resin compositions has a low dielectric loss tangent, a highly efficient electronic device for high frequency signals having a low dielectric loss property can be provided.

Example 12

A resin encapsulated type semiconductor device was manufactured as described below. In FIG. 7A, a semiconductor chip 3 is mounted by way of an adhesive on an insulating substrate 20 having lead terminals 19 on the periphery. In FIG. 7B, lead terminals 19 were connected to the associated electrodes in the semiconductor chip by way of wiring 7. In FIG. 7C, molding was conducted using the resin composition of Example 10, while leaving part of the lead terminals. Multi-stage heating was applied under the curing conditions of 120° C./30 min, 150° C./30 min, and 180° C./100 min at a pressure of 1.5 MPa. In the semiconductor device, since the insulating layer covering the wiring has a low dielectric constant and a low dielectric loss tangent resin, the signal transmission speed is high and the signals are less attenuated by the dielectric loss.

Example 13

Figure 8A:
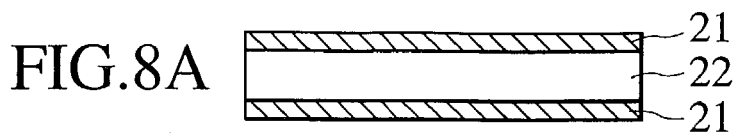
Figure 8B:
Figure 8C:
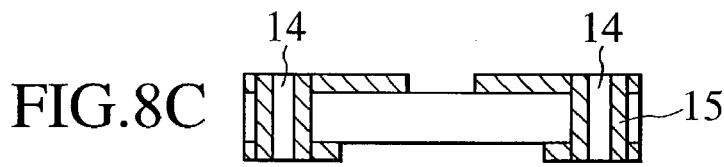
Figure 8D:
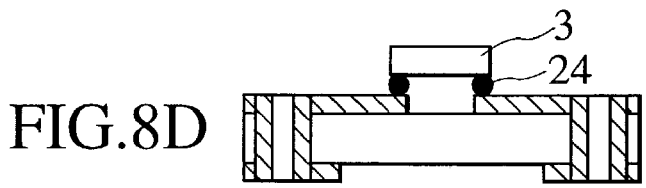
Figure 8E:
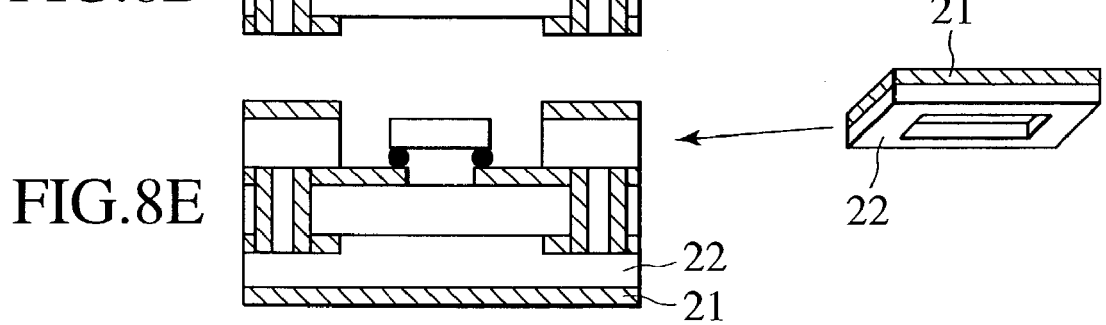
Figure 8F:
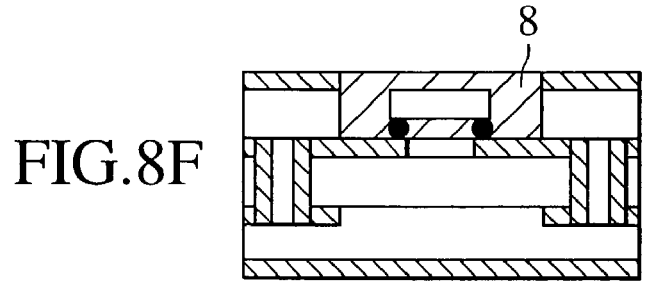
Figure 8G:
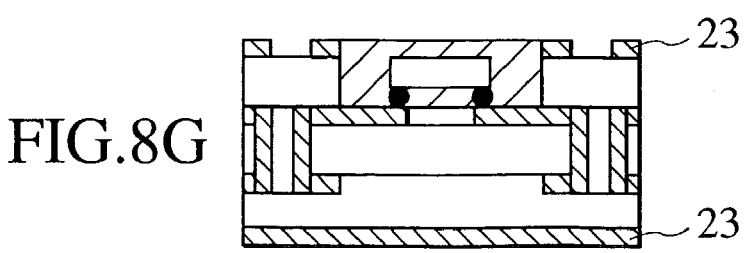

A resin encapsulated type semiconductor device was manufactured as described below. In FIG. 8A, the low dielectric constant prepreg 22 of Example 8 and copper foils 21 are stacked and pressed to prepare a lamination plate. In FIG. 8B, wiring 23 is formed on the front and rear faces of the lamination plate. In FIG. 8C, through holes 14 are bored at predetermined positions and the plating films 15 are applied to the through holes 14 to electrically connect the front and rear faces of the lamination plate. In FIG. 8D, electrodes of a semiconductor chip 3 and the wiring on the lamination plate are bonded by way of gold stud pumps 24. In FIG. 8E, a predetermined shaped stack of a low dielectric constant prepreg 22 and a copper foil 21 are stacked and bonded by pressing. In FIG. 8F, the semiconductor chip 3 is covered with the resin composition of Example 11 and heated to form a low dielectric constant insulating layer 8. In FIG. 8G, the copper foil 21, which serves as the outer layer, is patterned to form outer layer wiring 23. When the semiconductor chip is thus buried in the multi-layered wiring substrate, since there is no requirement for using bonding wire, the transmission distance is shortened and the loss is further lowered. Further, various kinds of devices can be formed inside and on the surface of the multi-layered wiring substrate. This can further reduce the size of the electronic device for high frequency signals.

Example 14

Figure 9A:
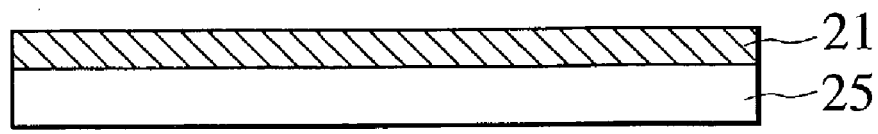
Figure 9B:
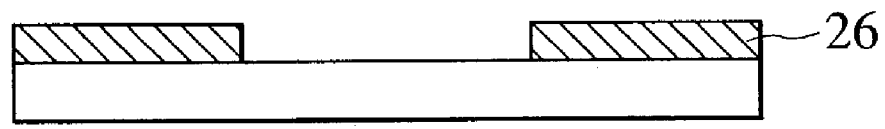
Figure 9C:
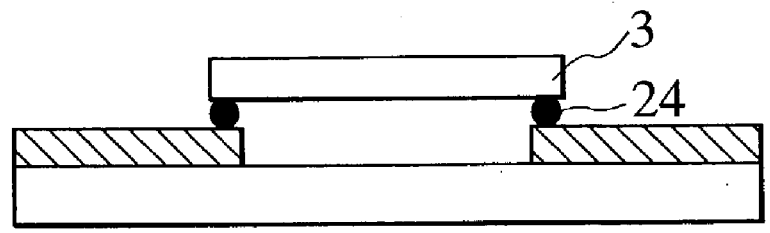
Figure 9D:
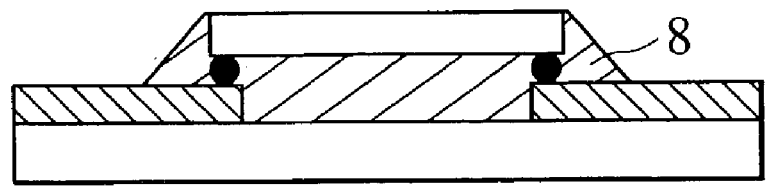

A resin encapsulated type semiconductor device was manufactured as described below. FIGS. 9A to 9D show an example of production of the device by a tape automated bonding (TAB) method. In FIG. 9A, a tab tape is prepared by stacking and pressing a carrier tape 25, comprising a non-woven fabric, the resin composition of Example 1 (resin content 30–50 wt %) and a copper foil 21. The pressing condition is 180° C./100 min and at 1.5 MPa. The thickness of the carrier tape is 30 to 100 μm to provide the tab tape with flexibility. In FIG. 9B, the copper foil 21 on the tab tape is patterned to form lead terminals 26. In FIG. 9C, electrodes on a semiconductor chip 3 are connected to the associated lead terminals 26 on the tab tape by way of metal stud bumps 24. In FIG. 9D, the semiconductor chip 3 is covered with the low dielectric constant resin composition 8 of Example 11 and the resin was cured. Multi-stage heating is applied under the curing conditions of 120° C./30 min, 150° C./30 min, and 180° C./100 min. Since both the carrier tape and the encapsulation resin have a low dielectric constant and a low dielectric loss tangent, a tape carrier type package with low dielectric loss can be provided.

Examples of methods of manufacture of semiconductor packages have been described above, and the encapsulation method, encapsulated shape, wiring forming method and connection method therefor can be selected optionally. The gist of the invention is to protect and insulate a semiconductor chip and peripheral wiring by using a low dielectric loss tangent resin composition, which enables low dielectric loss and high-speed transmission.

Example 15

A method of preparing an inductor (coil) is described below. In FIG. 10A, a through hole 14 is bored at a predetermined position of a lamination plate comprising the low dielectric constant prepreg 22 and the copper foils 21 of Example 8, and a plating film 15 is applied to the through hole 14. Then, the copper foils 21 are patterned to prepare coil circuits 28 and pads 27 on both surfaces. In FIG. 10B, the low dielectric constant prepregs 22 and the copper foils 21 are stacked and pressed for lamination bonding. In FIG. 1C, through holes 14 are bored at predetermined positions and plating film 15 is applied to the through holes 14. In FIG. 10D, the copper foils 21 as the outer layers are patterned to form wiring 23. The coil pattern may further be stacked by way of a through hole. It is also possible to form a plurality of coil patterns in one identical plane and join them by wiring. Since the inductor is covered with a low dielectric constant, low dielectric loss tangent insulating layer, this can provide a highly efficient circuit with an extremely low dielectric loss.

Example 16

Figure 11A:
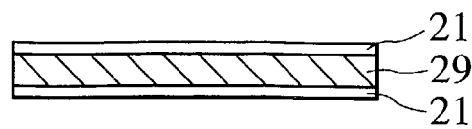
Figure 11B:
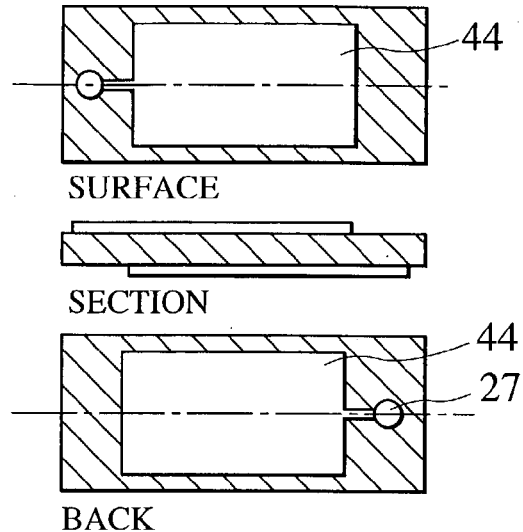
Figure 11C:
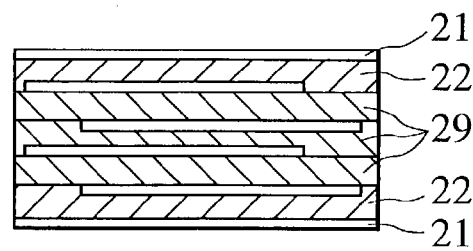
Figure 11D:
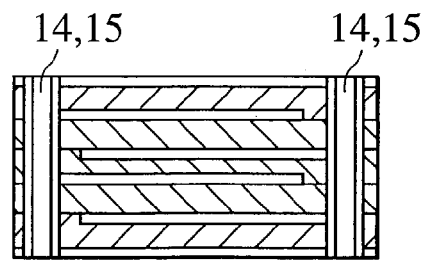
Figure 11E:
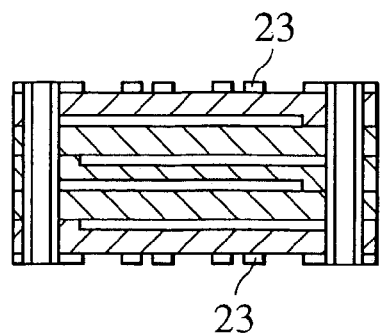

A method of preparing a capacitor is described below. In FIG. 11A, the high dielectric prepreg 29 of Example 9 and copper foils 21 are stacked and pressed to form a lamination plate. In FIG. 11B, both surfaces of the lamination plate are patterned to form a capacitor pattern 44 and pads 27. In FIG. 11C, a lamination plate having the capacitor pattern, the high dielectric constant prepreg 29 of Example 8, the low dielectric constant prepreg 22 and copper foils 21 are stacked and pressed for lamination bonding. The curing condition is 80° C./100 min at 1.5 MPa. In FIG. 11D, through holes 14 are bored at predetermined positions and plating layers 15 are applied to the through holes 14. In FIG. 11E, the copper foils, which serve as the outer layers, are patterned to form wiring 23. The capacitor circuits can further be multi-layered and also connected in parallel through the wiring in the outer layers. This can control the capacitance. Since the dielectric loss tangent of the capacitor is low, the dielectric loss of the same can be lowered. Further, since the dielectric constant is increased, the patterning area can be reduced, and, accordingly, this can contribute to a size reduction of the electronic devices.

Example 17

An example of preparing a pulse transformer is described below. Wiring substrates a to g shown in FIG. 12 to FIG. 18, respectively, are prepared by using the high dielectric constant prepreg of Example 9 and copper foils. The wiring substrates a and c, which are shown in FIGS. 12 and 14, respectively, have pads 27 for connection between the ground 30 and the inner layer wiring, and the wiring substrate b in FIG. 13 has ground layers on both surfaces. Wiring substrates d, e, f and g, which are shown in FIGS. 15 to 18, respectively, have spiral wiring 23 with a length of ¼ of the signal wavelength λ, and pads 27 and wiring 23 for the purpose of connection to external terminals. The wiring substrates a to g are stacked and bonded by way of high dielectric constant prepregs and the spiral wirings are connected by way of through holes so as to constitute an equivalent circuit, as shown in FIG. 19, to form a pulse transformer, as shown in FIG. 20. Reference numerals 31 to 34 in FIG. 19 each correspond to a spiral circuit having a length of $\lambda/4$. Since the pulse transformer of the invention uses a high dielectric constant insulating film, it has the excellent effect of shortening the wavelength and contributes to the size reduction of the electronic device for high frequency signals. Further, since the high dielectric constant insulating layer has an extremely small dielectric loss tangent, it has less dielectric loss and exhibits excellent high frequency characteristics.

Example 18

An example of preparing a stacked filter unit is described below. FIGS. 21 and 22A to 22C show an equivalent circuit and constituent members, respectively. A lamination plate corresponding to a component part of the equivalent circuit shown in FIG. 21 is prepared by using the high dielectric constant prepreg 29 of Example 9 and copper foil 21. This lamination plate is used as a wiring substrate having a strip circuit 36 (FIG. 22A) and as a wiring substrate having a capacitor circuit 37 (FIG. 22B). Then, these lamination plates, which are shown in FIGS. 22A and 22B, are stacked and bonded by way of the high dielectric prepreg 29 to manufacture a stacked filter unit, as shown in FIG. 22C. Each of the circuits of the stacked filter unit is connected through the end face to external electrodes 38 and to the ground 30. In FIGS. 22A to 22C, a connection circuit that is provided between the ground 30 and the strip circuit 36 is not illustrated. The stacked filter unit can provide desired transmission characteristics. The lamination filter unit of the invention has an extremely low dielectric loss tangent of the insulating layer and exhibits excellent high frequency characteristics, and the dielectric loss in the strip line resonator can be kept low.

Example 19

Figure 23B:
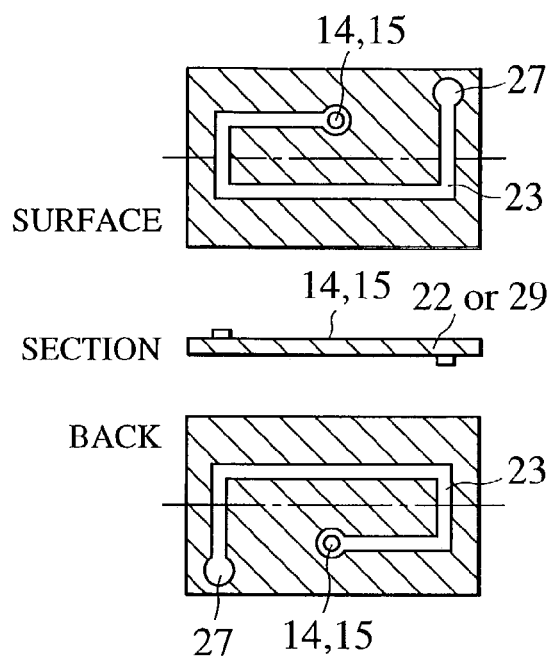
Figure 23C:
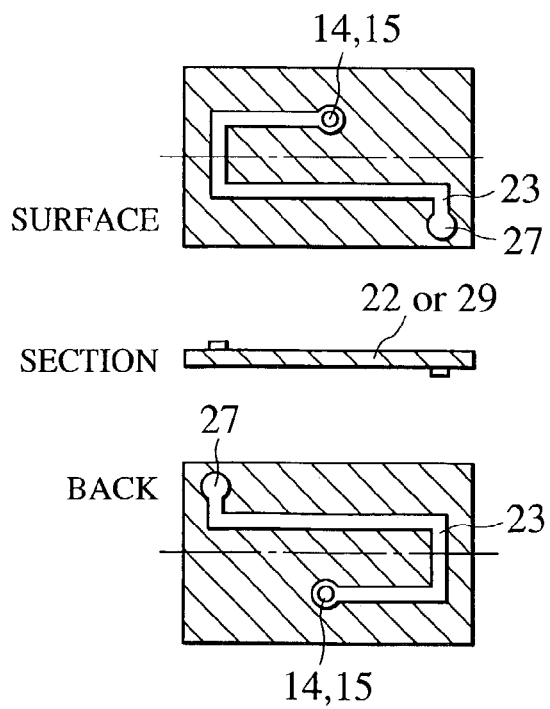
Figure 23D:
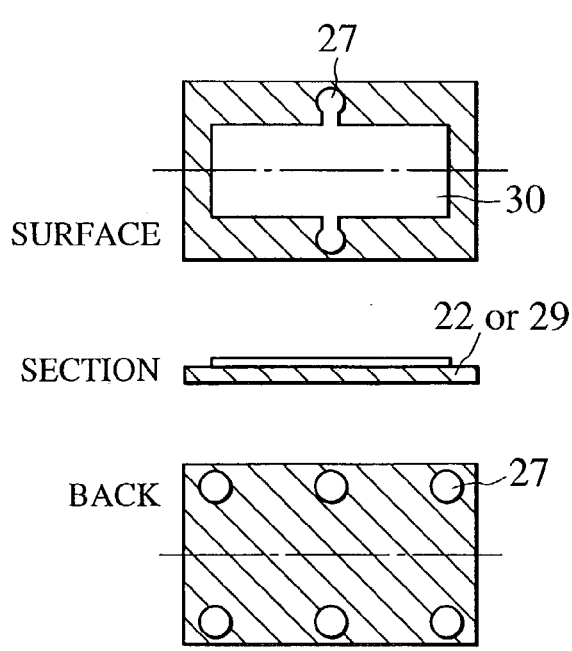

An example of preparing a coupler is described below. FIGS. 23A, 23B, 23C and 23D each shows a constituent member; FIG. 24 is a cross sectional view of the coupler; FIG. 25 is a wiring diagram of an inner layer circuit; and FIG. 26 shows an equivalent circuit of the coupler. FIGS. 23A and 23D each show a wiring substrate having pads 27 for connection with the ground 30 and external terminals or inner layer wiring. FIGS. 23B and 23C each show a wiring substrate having a spiral wiring 23 connected by a through hole 14 having a plating film 15 and pads 27 formed at the associated terminal ends of the wiring 23. The members are stacked by way of the prepregs 22 or 29 of the invention and are bonded by pressing, as shown in FIG. 24. Then, through holes 14 and the plating films 15 are provided for electrically connecting the inner layer and the outer layer. As shown by the wiring diagram in FIG. 25, wiring 23 and the ground 30 are connected by way of the plating films 15 that are applied to the through holes 14 to the pads 27 on the surface of the lamination substrate. Two pieces of spiral wiring 23 are provided as coils by which a transformer is formed. With the constitution described above, a coupler corresponding to the equivalent circuit shown in FIG. 26 is fabricated. When it is intended to make the band of the coupler broader, the low dielectric constant prepreg of Example 8 is used. In a case where it is desirable to reduce the size of the coupler, the high dielectric constant prepreg of Example 9 is used. The insulating layer used for the coupler of the invention has an extremely low dielectric loss tangent. Accordingly, the coupler of the invention is a highly efficient coupler with small dielectric loss.

Example 20

An example of a method of manufacturing an antenna circuit will be described below. FIGS. 27A to 27E show the steps of manufacturing an antenna. In FIG. 27A, a prepreg 22 or 29 of the invention and a copper foil 21 are stacked and bonded by pressing. In FIG. 27B, wiring 23 having pads 27 at both ends for an antenna are formed. In this example, the wiring is constituted as a reactance device having an antenna length of about $\lambda/4$ of the frequency used, and it is formed to have a serpentine configuration. In FIG. 27C, prepregs 22 or 29 and copper foils 21 are stacked on the wiring 23 for forming an antenna, and they are stacked and bonded by pressing. In FIG. 27D, through holes 14 are bored at predetermined positions of the outer layers, and plating films 15 are applied to the through holes. In FIG. 27E, the copper foils on the outer layers are etched to form pads 27 for connection with external terminals. In a case of using the low dielectric constant prepreg 22 of Example 8 for the insulating layer of the antenna circuit, this can cope with broad band signals. On the other hand, in a case of using the high dielectric constant prepreg of Example 9 for the insulating layer, the size of the circuit can be reduced by the effect of shortening the wavelength. Since the antenna circuit of the invention has an extremely low dielectric loss tangent, a highly efficient antenna with less dielectric loss can be provided.

Example 21

An example of a method of manufacture of a voltage-controlled oscillator (VOC) will be described. FIGS. 28 and 29 are a cross-sectional view and an equivalent circuit diagram, respectively. A multi-layered wiring board is formed of wiring 23 for power supply or signals, an inductor circuit 39, capacitor circuits 37, strip circuits 36, ground 30, external electrodes 38, through hole wiring for interlayer connection (not illustrated in the drawing) and the like. Further, electronic elements 40, such as a semiconductor device and a resistor, were mounted on the multi-layered wiring board to form a circuit, as shown in FIG. 29. The insulating layer for each of the wirings is selected, depending on the property of the circuit. An insulating film of low dielectric constant and low dielectric loss tangent is preferred for the insulating layer of the inductor circuit 39 and the wiring 23; and, thus, the low dielectric constant prepreg 22 of Example 8 is used for the insulating film, and the high dielectric constant prepreg 29 of Example 10 is used for the insulating layer of the strip line 36 forming the resonator, in this example. With the constitution described above, a small sized and high performance voltage controlled oscillator with extremely low dielectric loss can be produced.

Example 22

An example of a method of manufacturing a power amplifier will be described. FIGS. 30 and 31 show an equivalent circuit of the power amplifier and a cross sectional view of the same, respectively. The power amplifier is produced by mounting or forming electronic elements 40, such as a capacitor, an inductor, a semiconductor and a resistor, onto the outer layer, and providing a strip circuit 36, ground 30, a power supply circuit (not shown), through holes (not shown) and wiring 23 for coupling the various electronic elements inside and on the surface of the multi-layered substrate. In a case of using the low dielectric constant prepreg 22 for the insulating layer of this device, high speed transmission and reduced dielectric loss can be provided; and, in a case of using the high dielectric constant prepreg 29, the size of the circuit is reduced and the dielectric loss of the circuit is lowered.

Example 23

An example of fabricating an RF module will be described. FIG. 32 is a cross sectional view of an RF module. An RF module is formed by disposing a capacitor circuit 37, an inductor circuit 39, an antenna circuit 41, a strip circuit 36, a semiconductor 42 and a resistor 43 on the inner layer or the outer layer of the multi-layered substrate and connecting the elements with the wiring 23 and the through holes (not illustrated in the figure). The transmission speed is increased and the dielectric loss is lowered by using the low dielectric constant prepreg 22 for the insulating layer of this module, and the size of the circuit is reduced and the dielectric loss is lowered by using the high dielectric prepreg 29 for the insulating layer in the device.

According to the examples described above, various kinds of electronic devices for high frequency signals can be provided using a low dielectric loss tangent resin composition that has an excellent high frequency characteristic as the insulating layer. Since the insulating layer of the electronic device has a low dielectric loss tangent, it can provide an electronic device for high frequency signals of low dielectric loss and high efficiency. Further, the size of the electronic device for high frequency signals can be decreased by making the dielectric constant of the low dielectric loss tangent resin composition higher.

According to the present invention, various kinds of electronic devices for high frequency signals can be provided by using a low dielectric loss tangent resin composition that has an excellent high frequency characteristic as an insulating layer.

What is claimed is:

1. An electronic device for high frequency signals having conductor wiring for transmitting an electric signal at 0.3 to 100 GHz and an insulating layer which is a curing product of a thermosetting resin composition, wherein the insulating layer has a crosslinked structure of a crosslinking ingredient represented by the following general formula (I):

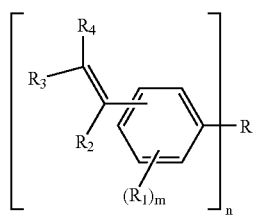

(I)

(where R represents a hydrocarbon skeleton, $R_1$, which may be identical or different from each other, represents a hydrogen atom or a hydrocarbon group of 1 to 20 carbon atoms, $R_2$, $R_3$ and $R_4$, which may be identical or different from each other, each represents a hydrogen atom or a hydrocarbon group of 1 to 6 carbon atoms, m is an integer of 1 to 4 and n is an integer of 2 or greater), and wherein the insulating layer includes a flame retardant.

2. An electronic device for high frequency signals as defined in claim 1, wherein a value of dielectric loss tangent at 1 GHz of the insulating layer is from 0.0005 to 0.0025.

3. An electronic device for high frequency signals as defined in claim 1, wherein the insulating layer contains a high molecular weight material with a weight average molecular weight of 5,000 or more.

4. An electronic device for high frequency signals as defined in claim 1, wherein the insulating layer is a composite material comprising a plurality of insulators having different dielectric constants.

5. An electronic device for high frequency signals as defined in claim 1, wherein the electronic device has an insulating layer having a dielectric constant of 1.5 to 3.0 at 1 GHz.

6. An electronic device for high frequency signals as defined in claim 5, wherein the insulating layer contains at least one kind of low dielectric constant layer selected from low dielectric constant resin particles, hollow resin particles, hollow glass balloons and gaps each with an average size of 0.2 to 100 µm.

7. An electronic device for high frequency signals as defined in claim 1, wherein the electronic device has an insulating layer having a dielectric constant of from 3.1 to 20 at 1 GHz.

8. An electronic device for high frequency signals as defined in claim 7, wherein the insulating layer contains ceramic particles or metal particles applied with insulating treatment, each of the ceramic particles and the metal particles having an average grain size of from 0.2 to 100 µm.

9. An electronic device for high frequency signals as defined in claim 1, wherein the flame retardant is red phosphorous particles or an organic flame retardant represented by the following formulae (II)–(VI):

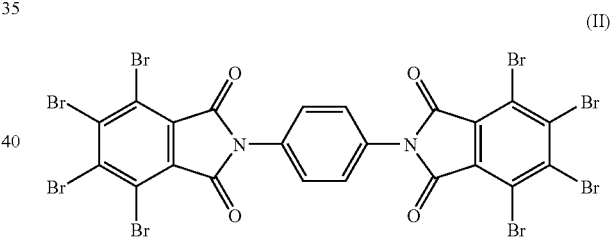

(II)

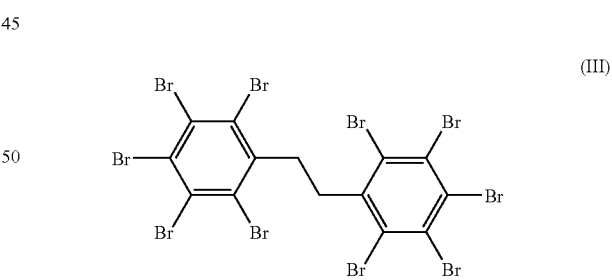

(III)

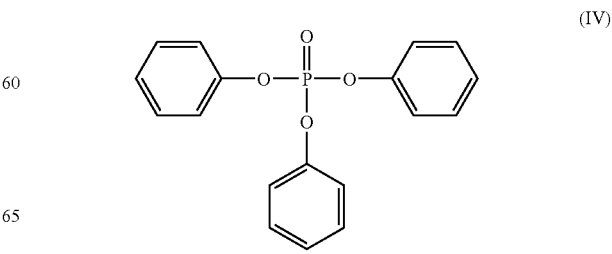

(IV)

-continued

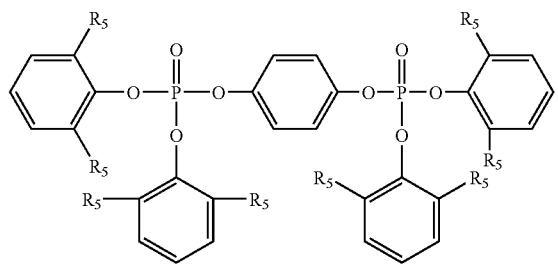
(V)

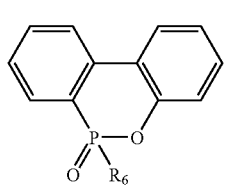
(VI)

(where $R_5$, $R_6$, which may be identical or different from each other, each represents a hydrogen atom or organic residue of 1 to 20 carbon atoms).

10. An electronic device for high frequency signals as defined in claim 1, wherein the insulating layer contains one of phenolic resin, epoxy resin, cyanate resin, vinyl benzyl ether resin and crosslinkable polyphenylene oxide as a second crosslinking ingredient.

11. An electronic device for high frequency signals in which a semiconductor chip is sealed by an insulating layer, wherein the insulating layer contains a crosslinked structure of a crosslinking ingredient represented by the following general formula:

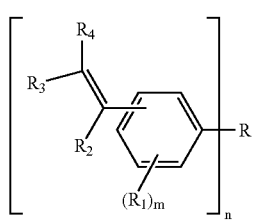
(I)

(where R represents a hydrocarbon skeleton, $R_1$, which may be identical or different from each other, represents a hydrogen atom or a hydrocarbon group of 1 to 20 carbon atoms, $R_2$, $R_3$ and $R_4$, which may be identical or different from each other, each represents a hydrogen atom or a hydrocarbon group of 1 to 6 carbon atoms, m is an integer of 1 to 4 and n is an integer of 2 or greater).

12. An electronic device for high frequency signals as defined in claim 11, wherein the electronic device for high frequency signals is a tape carrier type package.

13. An electronic device for high frequency signals as defined in claim 11, wherein the semiconductor chip is a bare chip mounted on a wiring substrate.

14. An electronic device for high frequency signals having a multi-layered wiring structure comprising an insulating layer and conductor wiring, wherein the insulating layer contains a crosslinked structure of a crosslinking ingredient represented by the following general formula (I):

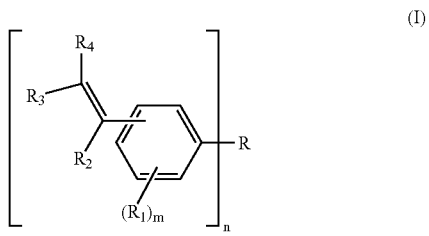
(I)

(where R represents a hydrocarbon skeleton, $R_1$, which may be identical or different from each other, represents a hydrogen atom or a hydrocarbon group of 1 to 20 carbon atoms, $R_2$, $R_3$ and $R_4$, which may be identical or different from each other, each represents a hydrogen atom or a hydrocarbon group of 1 to 6 carbon atoms, m is an integer of 1 to 4 and n is an integer of 2 or greater), and wherein the electronic device has at least one of functions of capacitor, inductor and antenna.

15. An electronic device for high frequency signals as defined in claim 14, wherein the electronic device forms one of a pulse transformer circuit, a filter circuit, a coupler, a voltage control generator, a power amplifier and an RF module.

16. An electronic device for high frequency signals as defined in claim 14, wherein insulating layers with different dielectric constants are mounted together as the insulating layer.

17. An electronic device for high frequency signals as defined in claim 1, wherein, the insulating layer has a dielectric constant at 1 GHz of less than about 2.6.

18. An electronic device for high frequency signals as defined in claim 1, wherein the crosslinking ingredient has a weight average molecular weight of at most 1000.

19. An electronic device for high frequency signals as defined in claim 1, wherein said flame retardant is included in an amount of 1 to 100 parts by weight based upon 100 parts by weight for total amount of crosslinking agent.

* * * * *